United States Patent
Gardner et al.

(10) Patent No.: US 11,177,250 B2
(45) Date of Patent: Nov. 16, 2021

(54) METHOD FOR FABRICATION OF HIGH DENSITY LOGIC AND MEMORY FOR ADVANCED CIRCUIT ARCHITECTURE

(71) Applicant: Tokyo Electron Limited, Tokyo (JP)

(72) Inventors: Mark I. Gardner, Cedar Creek, TX (US); H. Jim Fulford, Marianna, FL (US); Jeffrey Smith, Clifton Park, NY (US); Lars Liebmann, Mechanicville, NY (US); Daniel Chanemougame, Niskayuna, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/854,340

(22) Filed: Apr. 21, 2020

(65) Prior Publication Data

US 2021/0082901 A1    Mar. 18, 2021

Related U.S. Application Data

(60) Provisional application No. 62/901,591, filed on Sep. 17, 2019.

(51) Int. Cl.
  *H01L 25/00* (2006.01)
  *H01L 23/00* (2006.01)
  *H01L 29/06* (2006.01)

(52) U.S. Cl.
  CPC .............. *H01L 25/50* (2013.01); *H01L 24/27* (2013.01); *H01L 24/83* (2013.01);
  (Continued)

(58) Field of Classification Search
  CPC ..... H01L 23/50; H01L 24/27; H01L 29/0665; H01L 29/1434; H01L 2924/143; H01L 24/83; H01L 25/0657; H01L 24/05; H01L 2924/10253; H01L 2223/05; H01L 2223/4426; H01L 21/76254; H01L 21/185; H01L 2924/1431; H01L 2924/1434; H01L 21/28176
  See application file for complete search history.

(56) References Cited

U.S. PATENT DOCUMENTS 6,410,371 B1    6/2002    Yu et al.
6,765,227 B1    7/2004    Yu et al.
(Continued)

OTHER PUBLICATIONS

International Search Report and Written Opinion dated Nov. 5, 2020 in PCT/US2020/043192, 10 pages.

*Primary Examiner* — Jasmine J Clark
(74) *Attorney, Agent, or Firm* — Oblon, McClelland, Maier & Neustadt, L.L.P.

(57) ABSTRACT

Techniques herein include methods for fabricating high density logic and memory for advanced circuit architecture. The methods can include forming multilayer stacks on separate substrates and forming bonding films over the multilayer stacks, then contacting and bonding the bonding films to form a combined structure including each of the multilayer stacks. The method can be repeated to form additional combinations. In between iterations, transistor devices may be formed from the combined structures. Ionized atom implantation can facilitate cleavage of a substrate destined for growth of additional multilayers, wherein an anneal weakens the substrate at a predetermined penetration depth of the ionized atom implantation.

20 Claims, 23 Drawing Sheets

(52) U.S. Cl.
CPC .. *H01L 29/0665* (2013.01); *H01L 2924/1431* (2013.01); *H01L 2924/1434* (2013.01)

(56) References Cited

U.S. PATENT DOCUMENTS

| | | |
|---|---|---|
| 7,560,361 B2 | 7/2009 | Frank et al. |
| 8,956,958 B2 | 2/2015 | Baillin |
| 9,406,748 B1 | 8/2016 | Balakrishnan et al. |
| 9,870,940 B2 | 1/2018 | Wang et al. |
| 2006/0035450 A1 | 2/2006 | Frank et al. |
| 2013/0221497 A1 | 8/2013 | Baillin |
| 2017/0040209 A1 | 2/2017 | Wang et al. |
| 2017/0148923 A1 | 5/2017 | Balakrishnan et al. |
| 2020/0091287 A1* | 3/2020 | Glass ................ H01L 29/78696 |

* cited by examiner

METHOD FOR FABRICATION OF HIGH DENSITY LOGIC AND MEMORY FOR ADVANCED CIRCUIT ARCHITECTURE

CROSS REFERENCE TO RELATED APPLICATIONS

This present disclosure claims the benefit of U.S. Provisional Application No. 62/901,591, filed on Sep. 17, 2019, which is incorporated herein by reference in its entirety.

FIELD OF THE INVENTION

The present disclosure relates to a method of fabrication for integrated circuits and microelectronic devices, specifically for high density logic and memory formation.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In the manufacture of a semiconductor device, for example especially on the micro- or nanoscale, various fabrication processes are executed such as film-forming depositions, etch mask creation, patterning, material etching and removal, and doping treatments. These processes are performed repeatedly to form desired semiconductor device elements on a substrate. With microfabrication, transistors have been created in one plane with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

3D integration is seen as a viable option to continue semiconductor scaling. As the contacted gate pitch reaches its scaling limit due to manufacturing variability and electrostatic device limitations, 2D transistor density scaling stops.

3D integration, i.e. the vertical stacking of multiple devices, aims to overcome these scaling limitations by increasing transistor density in volume rather than area. Complementary metal oxide semiconductor (CMOS) very-large-scale integration (VLSI) scaling, as used for example in CPU or GPU products, is exploring adoption of 3D integration as a primary means of moving the semiconductor roadmap forward, and thus desires enabling technologies. One such technology can take advantage of thermal bonding of separate nanoplane layer stacks on separate substrates to form a combined layer stack and increase resulting transistor density.

SUMMARY

The present disclosure relates to a method of fabricating a semiconductor device, the method including: forming a first multilayer stack on a first surface of a first substrate, the first substrate having a second surface opposite the first surface of the first substrate, the first multilayer stack comprising alternating layers of a first material and a second material; forming a second multilayer stack on a second surface of a second substrate, the second substrate having a first surface opposite the second surface of the second substrate, the second multilayer stack comprising alternating layers of a third material and a fourth material; implanting ionized atoms to a predetermined depth in the first surface of the second substrate; forming a first bonding film on a top surface of the first multilayer stack and forming a second bonding film on a top surface of the second multilayer stack; aligning the first substrate with the second substrate such that the first bonding film is in contact with the second bonding film; annealing the first substrate and the second substrate to bond the first bonding film with the second bonding film and form a combined structure, the annealing also weakening a portion of the second substrate approximately at the predetermined depth of the implanting.

The method additionally includes: removing the weakened portion of the second substrate; and reducing a cleaved thickness of the second substrate to a predetermined thickness after removing the weakened portion.

The method additionally includes: forming a third multilayer stack on a first surface of a third substrate, the third substrate having a second surface opposite the first surface of the third substrate, the third multilayer stack comprising alternating layers of the third material and the fourth material; forming a fourth multilayer stack on the second substrate of the combined structure, the fourth multilayer stack comprising alternating layers of the first material and the second material with each layer formed by epitaxial growth beginning from the surface formed from removing the weakened portion of the second substrate after thickness reduction; forming a third bonding film on a top surface of the third multilayer stack and forming a fourth bonding film on a top surface of the fourth multilayer stack; aligning the third substrate with the combined structure such that the third bonding film is in contact with the fourth bonding film; and annealing the combined structure and the third substrate to bond the third bonding film with the fourth bonding film, thus making the third substrate part of the combined structure.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

Figure 1:
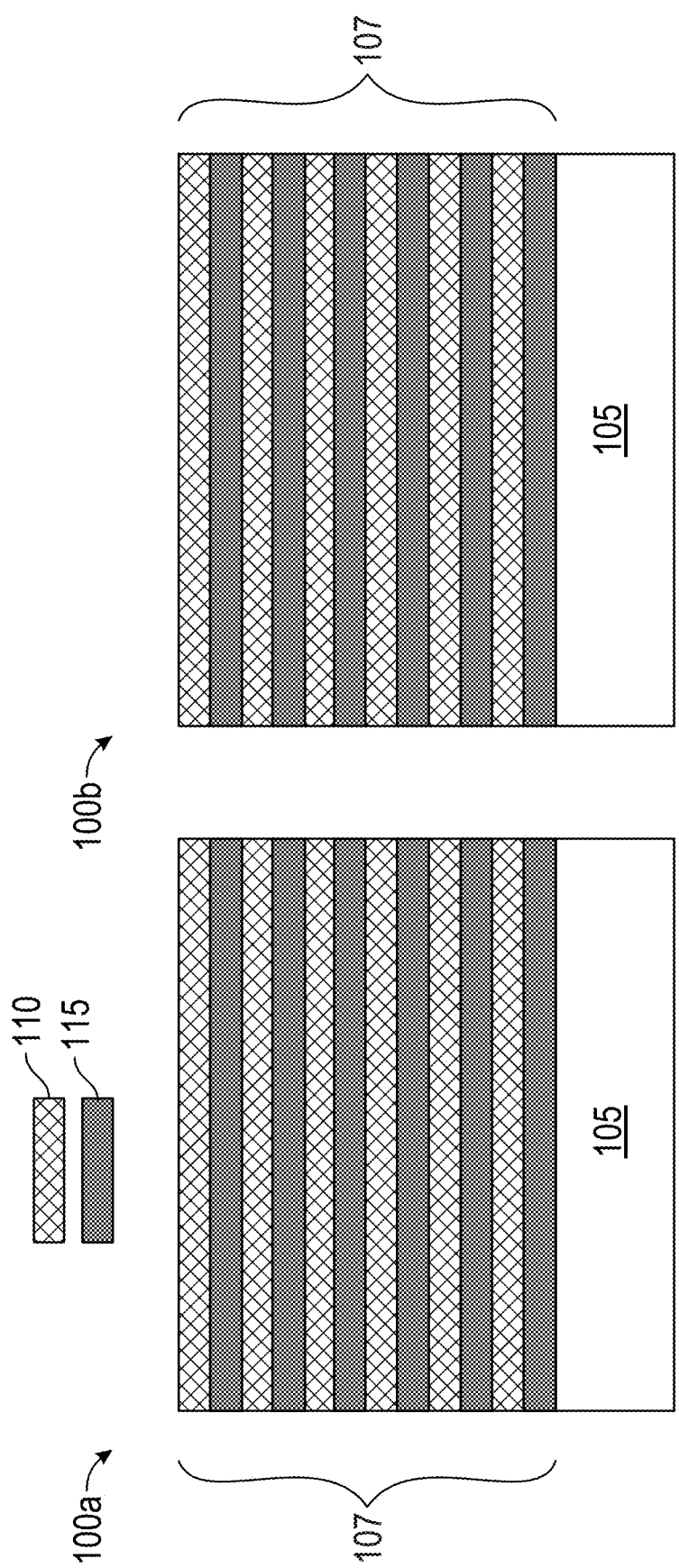
FIG. 1 is a cross-sectional view of a substrate showing an example result of a nanolayer stack, according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Techniques herein include methods for creating high-density 3D logic circuits. Techniques include forming nanoplane layer stacks on two or more substrates and bonding these substrates together at relatively low temperatures. The nanoplane layer stacks can then be turned into transistor, or logic or memory planes. Alternatively, stacks of logic and/or memory formed on single-crystal silicon can be stacked and bonded together. The stacks can be partially-formed devices or fully formed devices.

Bonding herein is effected by molecular bonds established between the surfaces of two substrates placed into contact. Substrates with an epitaxial stack or device stacks have a bonding surface formed thereon, such as an oxide film or carbon-containing film. These interface films are aligned in contact with each other at ambient conditions. Initial adhesion occurs due to the van der Waals forces, and then a thermal annealing treatment is used that transforms the room temperature bonds (weak bonds) into covalent bonds (strong bonds). This technique provides a strong bond from a small thickness interface at low temperatures and results in effective bonding of nanoplanes to enable 3D integration logic needs. Such techniques provide maximum use of silicon base area stacked vertically. Techniques herein enable forming more planes of transistors at a high quality of silicon and channel materials.

Embodiments herein provide methods for forming semiconductor devices. FIG. 1 is a cross-sectional view of a substrate 105 showing an example result of a micro- or nanoscale multilayer stack 107 (hereinafter referred to as "nanolayer stack 107"), according to an embodiment of the present disclosure. In an embodiment, the substrate 105 includes a top surface and a bottom surface, and the nanolayer stack 107 can be formed on the top surface of the substrate 105 of a first wafer 100a. For example, twelve layers of alternating nanolayer material can be formed. The nanolayer stack 107 can include alternating layers of a first material 110 and a second material 115, wherein the first material 110 can be silicon and the second material 115 can be SiGe, for instance. The nanolayers can be formed, for example, via a complementary field effect transistor (CFET) process flow which can be followed up to post nanolayer epitaxial growth. It may be appreciated that a varying numbers of layers can be formed based on a desired final device and varying techniques may be used to form the layers on the substrate 105. The nanolayer stack 107 can be formed on more than one wafer in a similar method, for example on a second wafer 100b. A substrate 105 of the second wafer 100b can include a top surface and a bottom surface, and the nanolayer stack 107 can be formed on the bottom surface of the substrate 105 of the second wafer 100b. It may be appreciated that the nanolayer stack 107 of the first wafer 100a and the nanolayer stack 107 of the second wafer 100b can include different materials in the respective nanolayer stacks 107. Thus, the nanolayer stack 107 of the first wafer 100a can include the first material 110 and the second material 115, while the nanolayer stack 107 of the second wafer 100b can include a third material and a fourth material alternating with one another.

Figure 2:
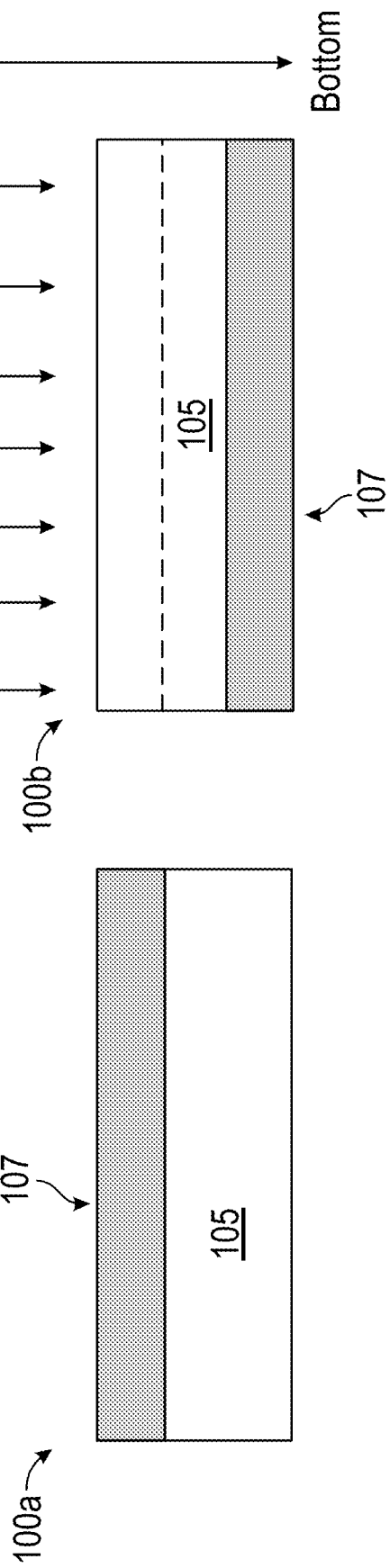
FIG. 2 is a cross-sectional view of a substrate showing a nanolayer stack during an ionized atom implantation of a second wafer, according to an embodiment of the present disclosure.

FIG. 2 is a cross-sectional view of the substrate 105 showing the nanolayer stack 107 during an ionized atom implantation of the second wafer 100b, according to an embodiment of the present disclosure. In an embodiment, ionized atoms, for example, cleaving particles, can be implanted into the surface opposite the nanolayer stack 107 on the second wafer 100b to produce a cleave 109. The multiple layers of the nanolayer stack 107 are simplified into a single layer on the first wafer 100a and the second wafer 100b for subsequent figures in this embodiment. As shown, the top surface of the second wafer 100b can be implanted with the ionized atoms. The ionized atoms can be selected from a relatively light element material, such as $H_2$, H, He, or B. For example, implantation can include dual implantation of pairs of elements such as a combination of $H_2$ and He, or a combination of $H_2$ and boron. By way of a non-limiting example, when boron and $H_2$ are selected, boron can have an energy of 180 keV while $H_2$ can have an energy of 129 keV to match the implant ranges with boron having a dose of $5 \times 10^{14}$ to $5 \times 10^{15}$ ions/cm$^2$, and $H_2$ having a dose of 2 to $6 \times 10^{16}$ ions/cm$^2$. In another example to match the range of He and $H_2$ implantation, an energy of 45 keV for He can be used, while $H_2$ can have an energy of 30 keV, wherein both species can have a dose range of 2 to $6 \times 10^{16}$ ions/cm$^2$. A range of the dual implant can be adjusted such that the energy for each peak of the implanted ion species has a same range. One or more elements can be implanted in one or more process steps. Note that any energy can be used. Since the energy used can determine a depth of the cleave 109, both energies should be adjusted so the projected range of each ion is aligned to have a same ionized atom implantation depth to produce the cleave 109. In an example, the dual implant can significantly reduce an anneal temperature to <300° C. in order to separate the substrate 105 at the cleave 109. Alternatively, if just one implant is used, for example just $H_2$, the anneal temperature can be 400° C. to 600° C. The first water 100a can receive an ionized atom implantation as well, but in the present embodiment, the first wafer 100a does not receive the ionized atom implantation.

Figure 3:
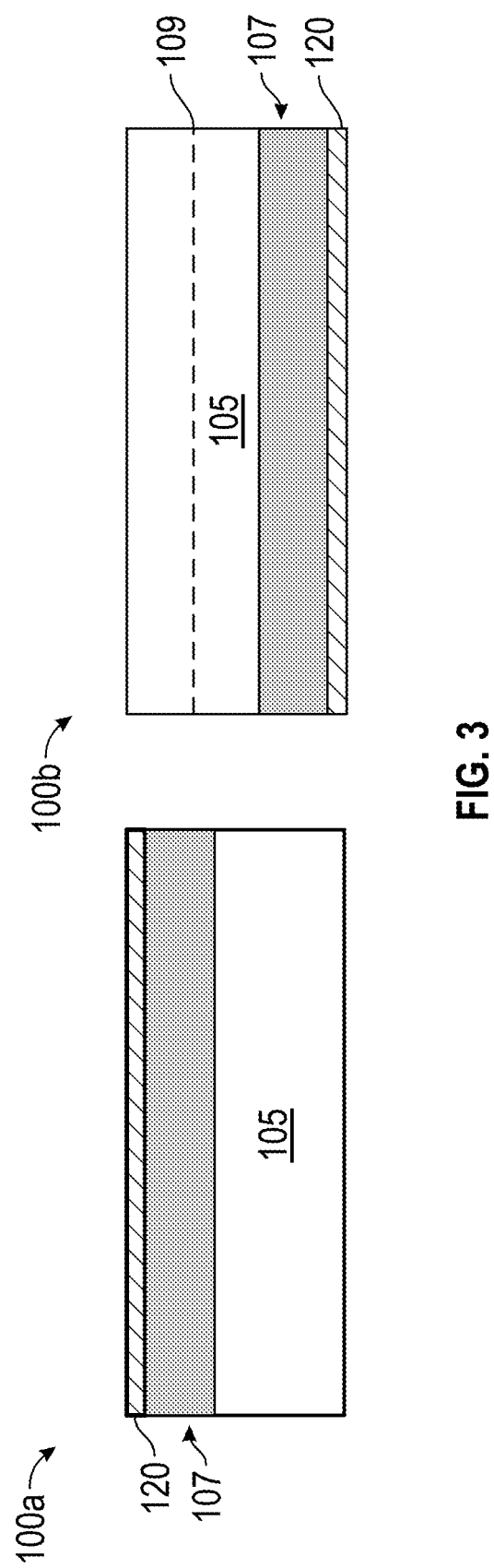
FIG. 3 is a cross-sectional view of a substrate showing a nanolayer stack during an oxide formation, according to an embodiment of the present disclosure.

FIG. 3 is a cross-sectional view of the substrate 105 showing the nanolayer stack 107 during an oxide formation, according to an embodiment of the present disclosure. In an embodiment, a chemical bonding film 120 can be formed on a top of the nanolayer stack 107. The top surface of the nanolayer stack 107 can be defined as the surface farthest from the substrate 105. Thus, as shown, the top surface of the nanolayer stack 107 on the first wafer 100a is in the direction of the top surface of the substrate 105 of the first wafer 100a, but the top surface of the nanolayer stack 107 on the second wafer 100b is in the direction of the bottom surface of the substrate 105 of the second wafer 100b. Example bonding films 120 include oxide and carbon-containing films, though other options can be used.

In an embodiment, the bonding film 120 can be a chemical oxide film or interface formed on each substrate 105. Both the first wafer 100a and the second wafer 100b can be cleaned using a two-step cleaning sequence. For example, a first clean can use a mixture of $H_2SO_4$:$H_2O_2$ in a ratio of, for example, (2.5 to 3.5):1, or preferably, 3:1, for 10 to 20 minutes. Following the first clean, the first wafer 100a and the second wafer 100b can be rinsed in deionized (DI) water with sonication for 10 to 20 minutes. A second clean can use a mixture of $NH_4OH$:$H_2O_2$:$H_2O$ in a ratio of, for example, (0.7 to 1.3):1:5, or preferably, 1:1:5. The second clean can be performed at a temperature of, for example, 20° C. to 30° C., or preferably, 25° C., for 10 to 20 minutes. Since $NH_3$ can evaporate at higher temperatures, it is beneficial to maintain the second clean at a cooler temperature. This results in higher generation of the —$NH_2$ groups that result in greater bonding of the covalent silicon after the anneal. This leaves a chemical oxide film (i.e. chemical bonding film 120) of approximately 5 to 15 Angstroms (A) on each of the first wafer 100a and the second wafer 100b that is suitable for forming a strong covalent silicon bond once heated. The chemical bonding film 120 can also cover other surfaces of the substrate 105.

Figure 4:
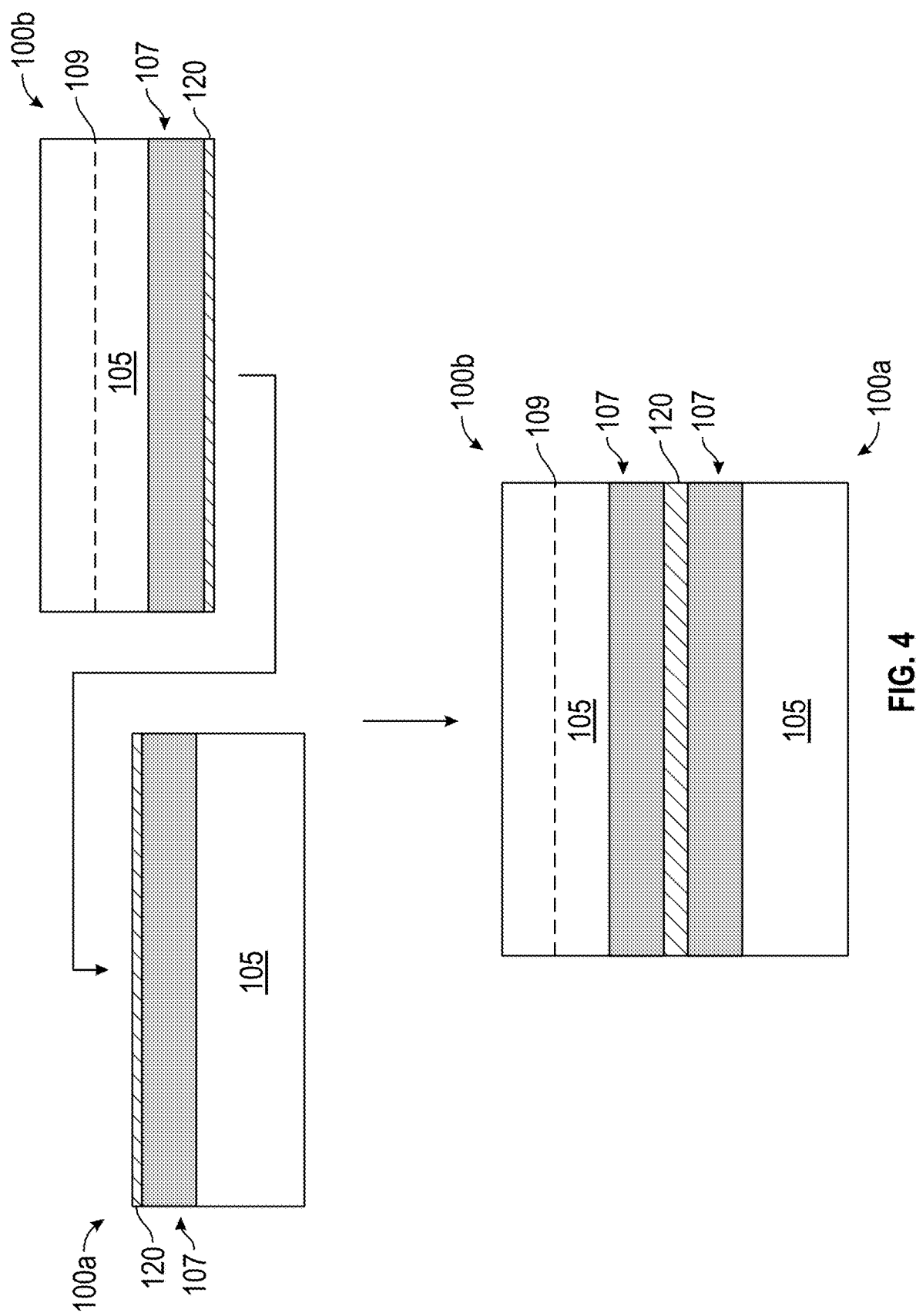
FIG. 4 is a cross-sectional view of a substrate showing a nanolayer stack during bonding, according to an embodiment of the present disclosure.

FIG. 4 is a cross-sectional view of the substrate 105 showing the nanolayer stack 107 during bonding, according to an embodiment of the present disclosure. With the chemical bonding film 120 formed, nanolayer stacks 107 of the first wafer 100a and the second wafer 100b can be bonded together. The first wafer 100a and the second wafer 100b can be aligned so that the chemical bonding film 120 on the first wafer 100a is in contact with the chemical bonding film 120 on the second wafer 100b. With the bonding films 120 of the first wafer 100a and the second wafer 100b in contact with one another, the first wafer 100a and the second wafer 100b can remain in place due to van der Waals forces. Subsequently, the anneal can be performed. The first wafer 100a and the second wafer 100b can be heated to between, for example, 200° C. to 500° C. for three to six hours. The annealing can facilitate formation of a strong, permanent, covalent silicon bond. Additionally, when ionized atoms are implanted in the top surface of the substrate 105 of the second wafer 100b, the anneal can induce a separation at the cleave 109 where the peak of the ionized atom implantation range was allowing for wafer thinning. Cleaving the substrate 105 of the second wafer 100b can reduce a thickness of the substrate 105 (e.g. the backside bulk silicon) without needing to etch or polish an entire thickness of the bulk substrate 105 material.

Note that the anneal can be separated into a two-step process because the cleaving can happen in a shorter time of, for example, a few minutes, followed by a relatively longer annealing process to join both of the bonding films 120. The chemical bonding films 120 of the first wafer 100a and the second wafer 100b can be aligned and bonded together via the anneal yielding a middle chemical bonding film 120 having a thickness in the range of, for example, 10 A to 30 A, or preferably, 20 A.

Figure 5:
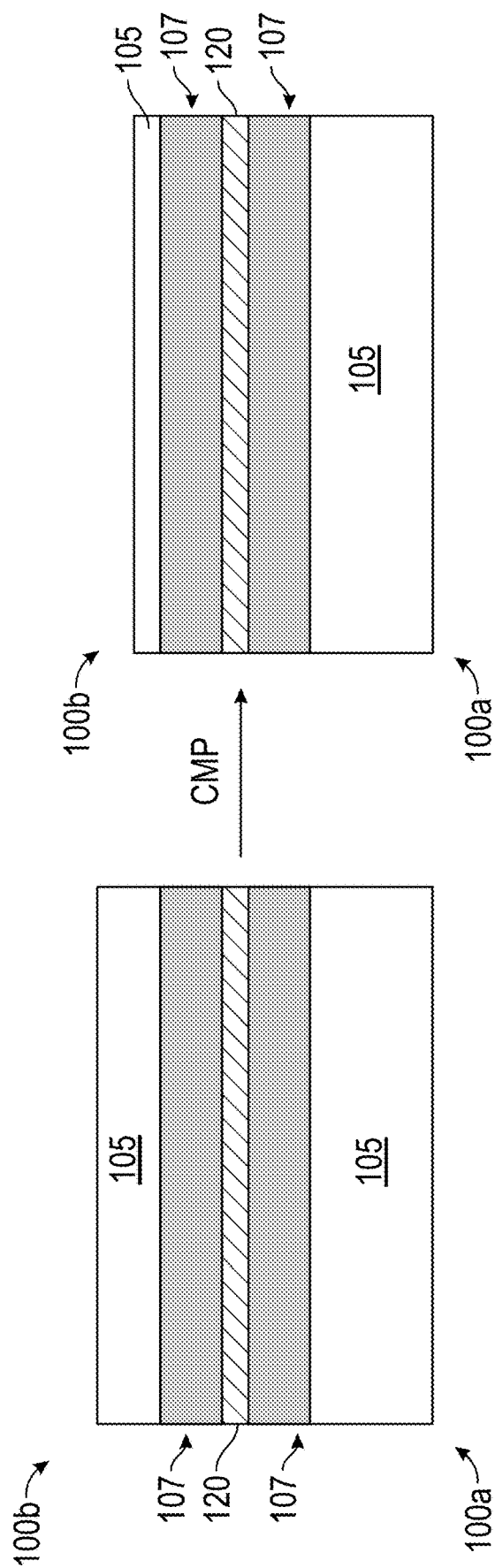
FIG. 5 is a cross-sectional view of a combined structure showing thinning of a substrate of a second wafer, according to an embodiment of the present disclosure.

FIG. 5 is a cross-sectional view of the combined structure showing thinning of the substrate 105 of the second wafer 100b, according to an embodiment of the present disclosure. With the first wafer 100a, and the second wafer 100b permanently bonded, they become a combined structure. The cleaved portion can then be removed and/or cleaned from the combined structure. Additional thinning can be performed. The additional thinning is useful for accessing one of the nanolayer stacks 107 for subsequent formation of semiconductor devices as well as for adding additional nanolayer stacks 107. For example, the entire substrate 105 of the second wafer 100b can be removed and the nanolayer stacks 107 (now having twice as many layers as compared to before combining, each half separated by the bonding film 120) can be formed into a semiconductor device. For example, a gate all around (GAA) device may be fabricated from the nanolayer stacks 107. Various techniques can be used for thinning the bulk substrate 105 material. For example, the top surface of the substrate 105 of the second wafer 100b can be etched or polished by chemical mechanical polishing (CMP) to result in a desired thickness, such as 10 to 50 nm of single-crystal silicon. Note that cleaved bulk silicon can be polished before additional uses. The cleaved portion left over from the cleave can be recycled as a substrate for tens of additional cycles. With lighter inert elements, such cleaning can be optional. If other elements such as boron are used, then a cleaning or polishing step can be used to remove boron because this element could function as a dopant if left in the bulk silicon.

At this point two nanolayer stacks 107 are bonded and accessible for additional stacks. As described above, for nanolayer stacks 107 with twelve layers each, now twenty-four alternating layers are in close proximity. Additional nanoplane layers can then be added to the combined structure by repeating the previous steps.

Figure 6:
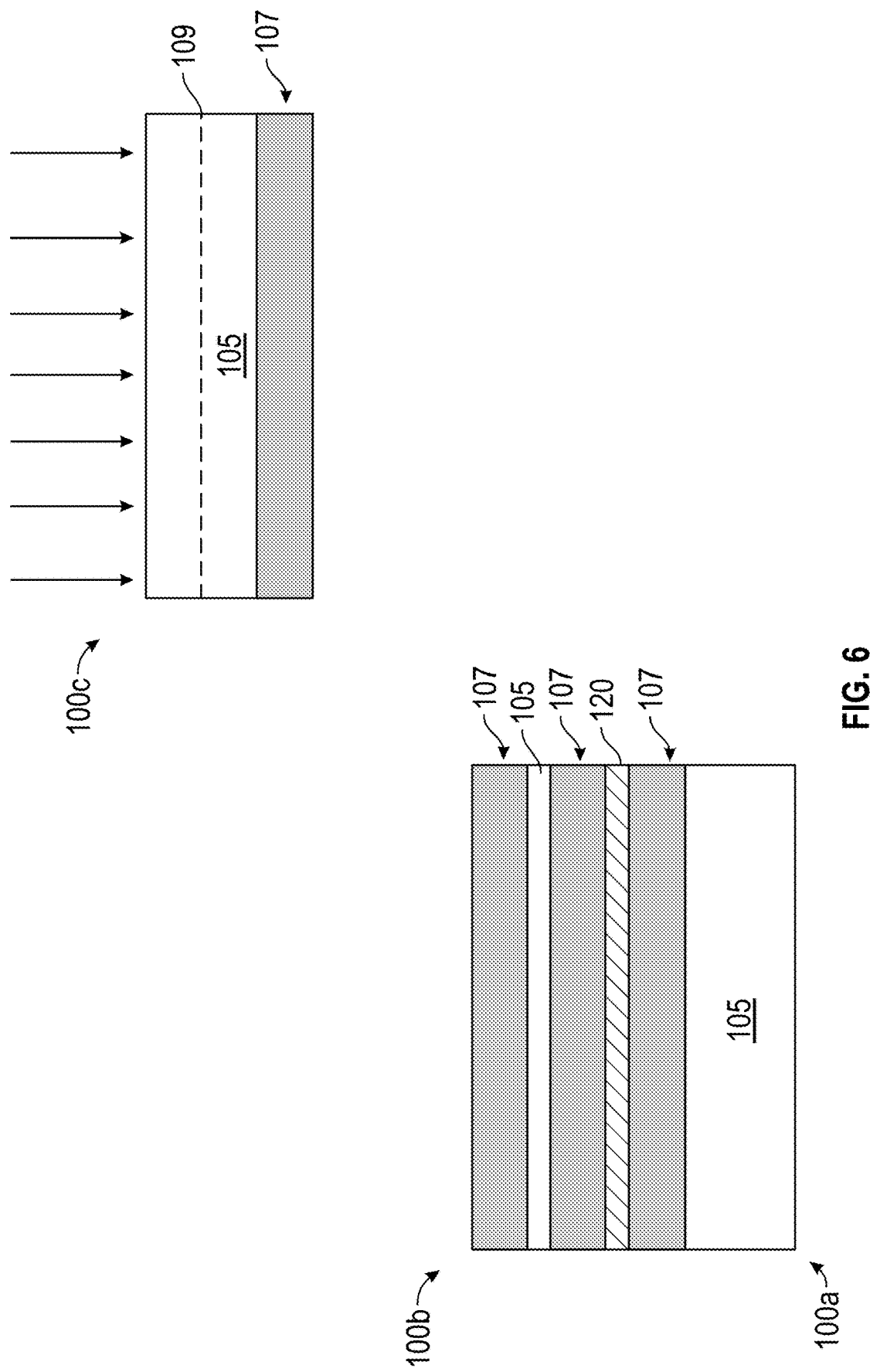
FIG. 6 is a cross sectional view of preparation of a third wafer, according to an embodiment of the present disclosure.

FIG. 6 is a cross sectional view of preparation of a third wafer 100c, according to an embodiment of the present disclosure. In an embodiment, the nanolayer stack 107 can be formed on the substrate 105 of the third wafer 100c, wherein the substrate 105 of the third wafer 100c includes a top surface and a bottom surface and the nanolayer stack 107 is formed on the bottom surface. Additionally, the nanolayer stack 107 can be formed on the thinned substrate 105 of the second wafer 100b on the combined structure. The top surface of the substrate 105 of the third wafer 100c can then be optionally implanted with ionized atoms for cutting or cleaving during anneal. The combined structure does not need to receive any ionized atom implantation. As similarly performed previously, the energy for ionized atom implantation can be adjusted so that a peak range or implantation depth of the ionized atoms is the same for all implants if using two or more different ionized atoms.

Figure 7:
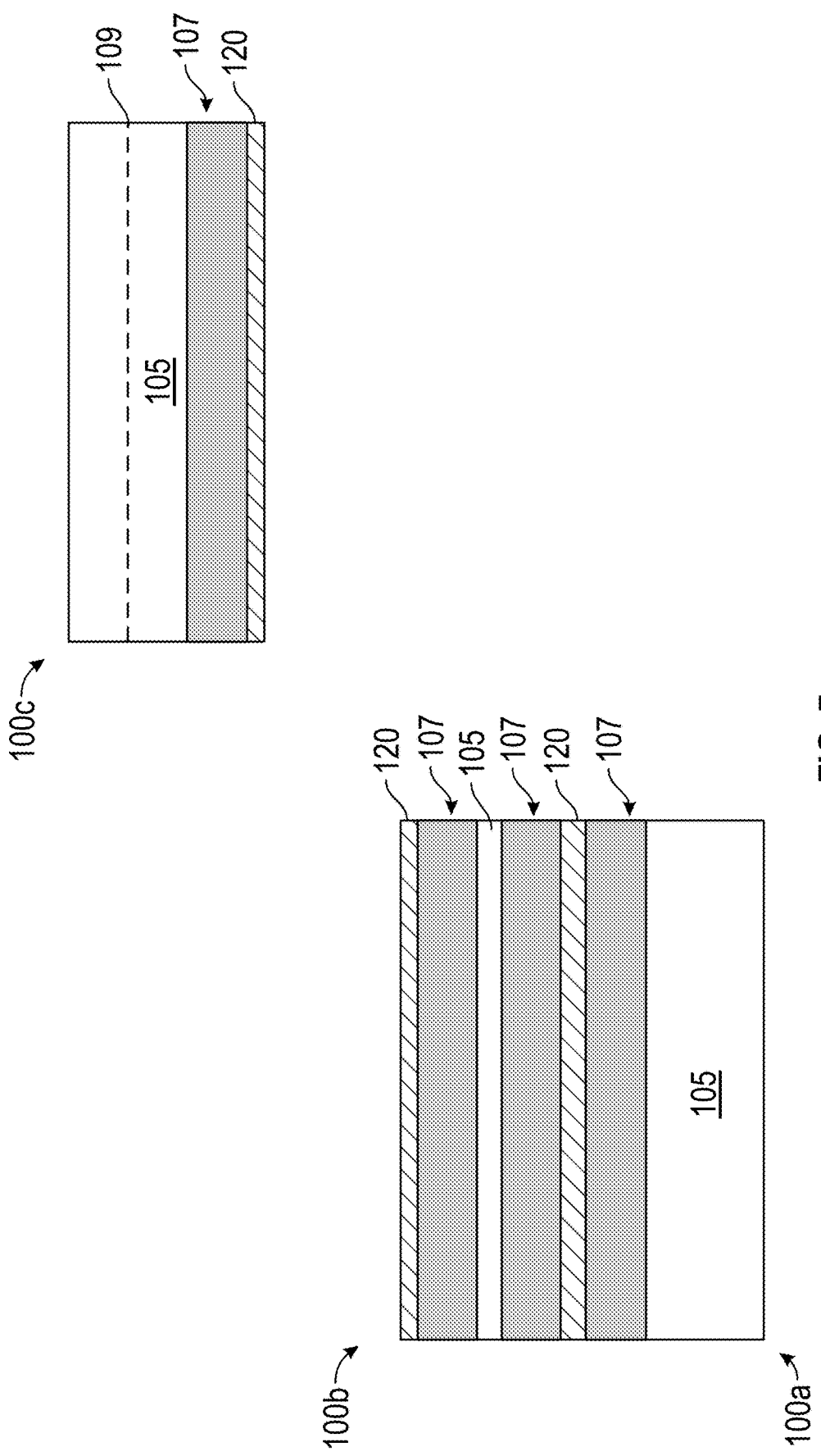
FIG. 7 is a cross-sectional view of a substrate showing a nanolayer stack during an oxide formation, according to an embodiment of the present disclosure.

FIG. 7 is a cross-sectional view of the substrate 105 showing the nanolayer stack 107 during an oxide formation, according to an embodiment of the present disclosure. In an embodiment, the chemical bonding film 120 (e.g. one or more oxide layers and/or carbon-containing layers) can be formed on the uncovered nanolayer stacks 107 of each structure (i.e. the combined structure and the third wafer 100c).

Figure 8:
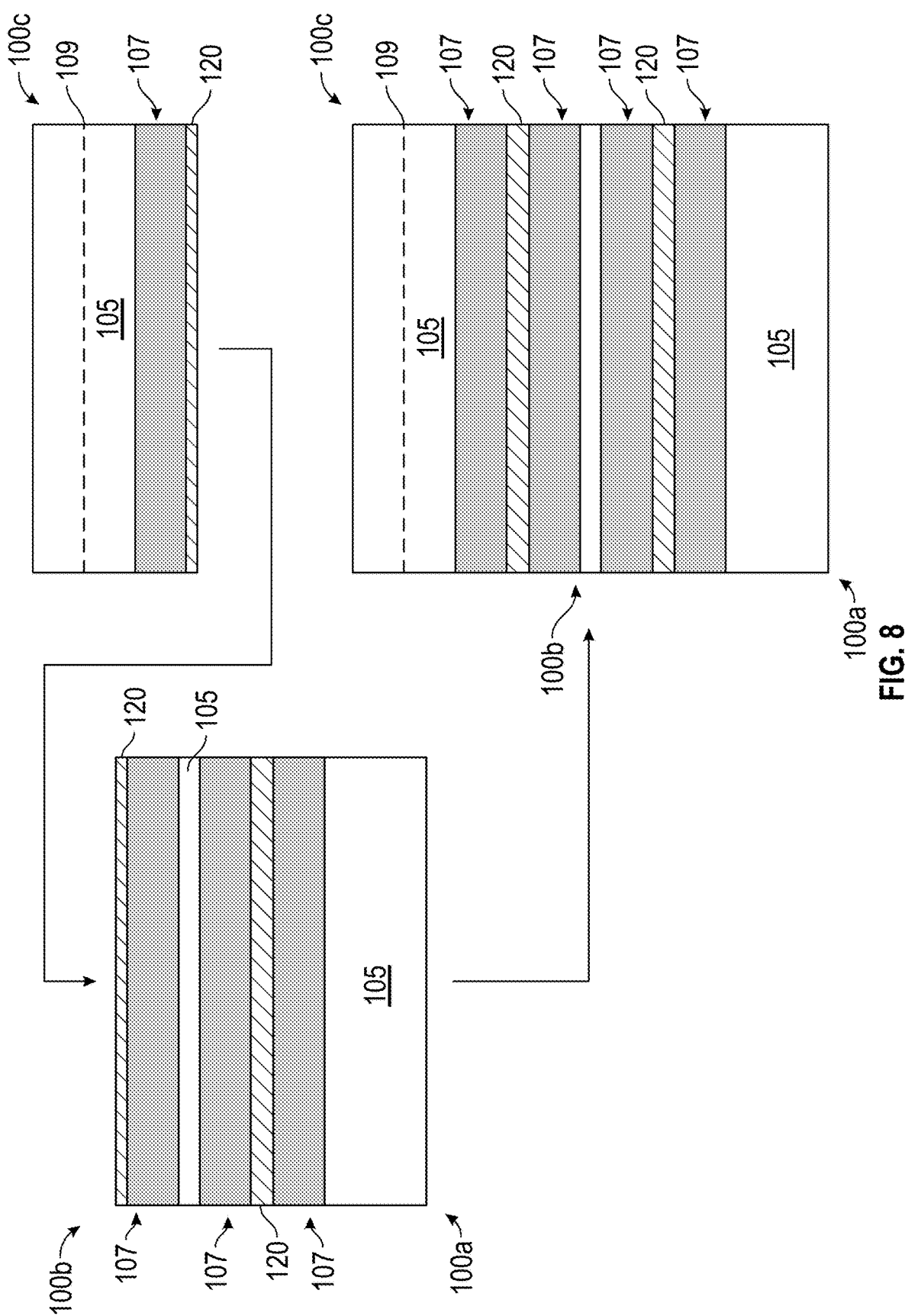
FIG. 8 is a cross-sectional view of a substrate showing a nanolayer stack during bonding, according to an embodiment of the present disclosure.

Processing continues as described above. FIG. 8 is a cross-sectional view of the substrate 105 showing the nanolayer stack 107 during bonding, according to an embodiment of the present disclosure. In an embodiment, nanolayer stacks 107 of the combined structure and the third wafer 100c can be bonded together. The combined structure and the third wafer 100c can be aligned so that the chemical bonding film 120 on the combined structure is in contact with the chemical bonding film 120 on the third wafer 100c. The anneal subsequently forms a strong, permanent silicon covalent bond between the bonding films 120. The anneal can also cause a cut or cleave in the substrate 105 of the third wafer 100c.

The cleaved substrate 105 of the third wafer 100c can be polished down and thinned. At this point, fabrication can continue with transistor creation. As described thusfar, forty-eight nanolayers of semiconductor material have been combined. In an example, the combined structure includes twenty-four single-crystal silicon planes, which can be used for transistor channel material. For example, the combined structure can be masked and etched to form nanochannels for FETs, memory components, etc. Alternatively, more nanolayers can be formed by repeating the steps of nanolayer stack 107 formation, and bonding by thermal annealing.

As can be appreciated, the combined first wafer 100a and second wafer 100b can be formed from any combination of bonding films 120 on nanolayer stacks 107 as described above.

Figure 9:
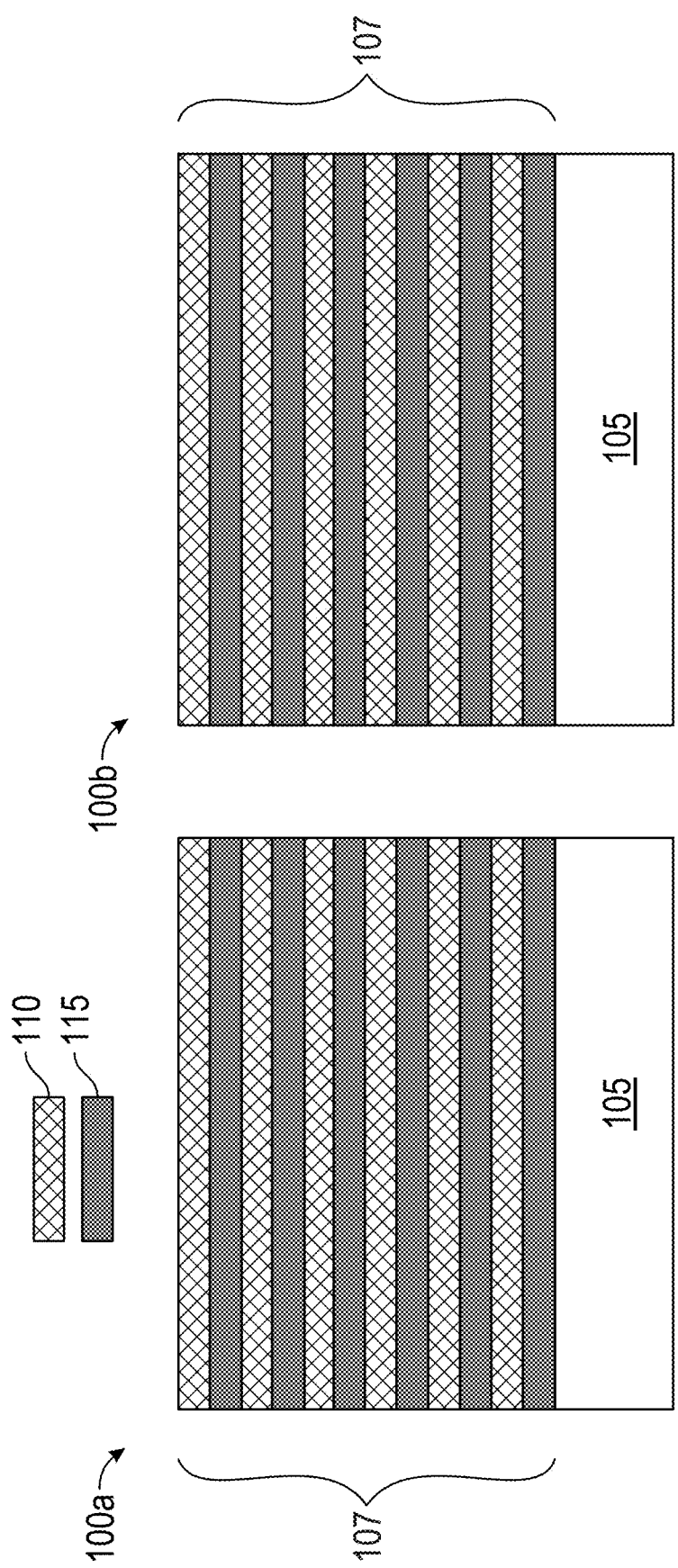
FIG. 9 is a cross-sectional view of a substrate showing an example result of a nanolayer stack, according to an embodiment of the present disclosure.

FIG. 9 is a cross-sectional view of the substrate 105 showing an example result of the nanolayer stack 107, according to an embodiment of the present disclosure. In an embodiment, the nanolayer stack 107 can be formed on the top surface of the substrate 105 of the first wafer 100a. The nanolayer stack 107 can be additionally formed on the second wafer 100b, wherein the nanolayer stack 107 can be formed on the bottom surface of the substrate 105 of the second wafer 100b.

Figure 10:
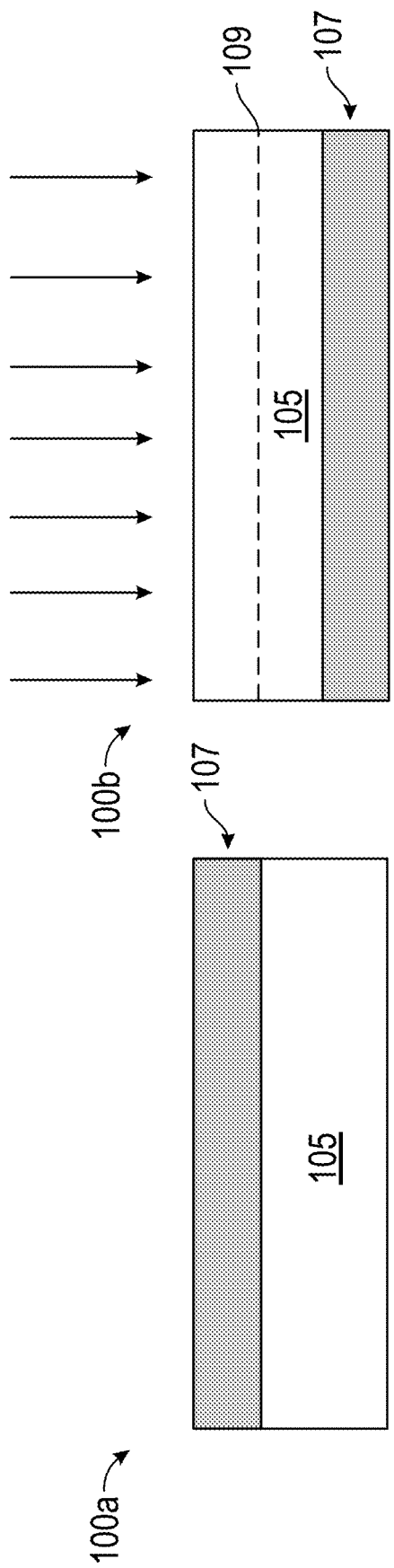
FIG. 10 is a cross-sectional view of a substrate showing a nanolayer stack during an ionized atom implantation of a second wafer, according to an embodiment of the present disclosure.

FIG. 10 is a cross-sectional view of the substrate 105 showing the nanolayer stack 107 during an ionized atom implantation of the second wafer 100b, according to an embodiment of the present disclosure. In an embodiment, ionized atoms can be implanted into the surface opposite the nanolayer stack 107 on the second wafer 100b to produce the cleave 109. As shown, the top surface of the second wafer 100b can be implanted with the ionized atoms.

Figure 11:
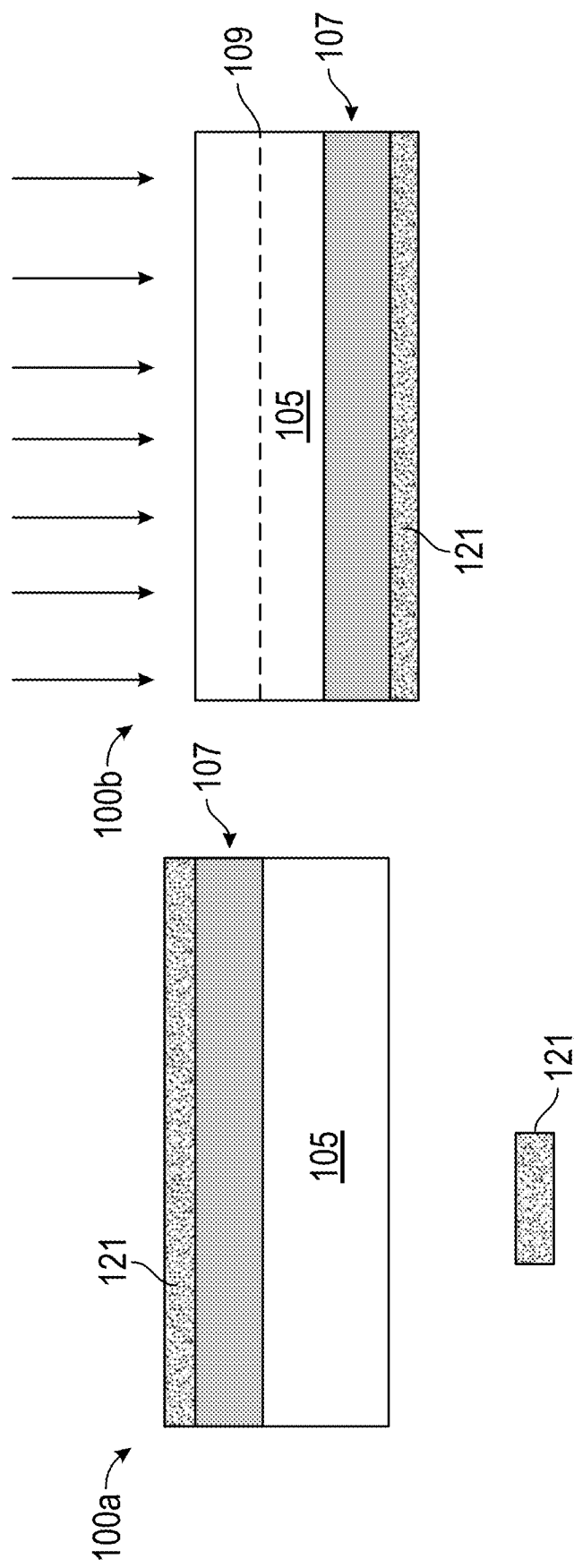
FIG. 11 is a cross-sectional view of a substrate showing a nanolayer stack during an oxide deposition, according to an embodiment of the present disclosure.

FIG. 11 is a cross-sectional view of the substrate 105 showing the nanolayer stack 107 during an oxide deposition, according to an embodiment of the present disclosure. In an embodiment, a deposited bonding film 121 can be formed via deposition on the top of the nanolayer stacks 107. If a cleaning step is followed, then a final cleaning step using HF can be used so that no chemical oxide is left. Then, an oxide is deposited on the nanolayer stacks 107 with a deposited thickness in the range of, for example, 30 A to 300 A, or preferably, 100 A, which is thicker than the chemical bonding film 120 from the wet cleaning process. For example, atomic layer deposition (ALD), chemical vapor deposition (CVD), plasma-enhanced chemical vapor deposition (PECVD), and metalorganic chemical vapor deposition (MOCVD) can be used, among others. The deposited bonding films 121 of the first wafer 100a and the second wafer 100b can be aligned and bonded together via the anneal yielding a middle deposited bonding film 121 having a thickness in the range of, for example, 60 A to 600 A, or preferably, 200 A.

Figure 12:
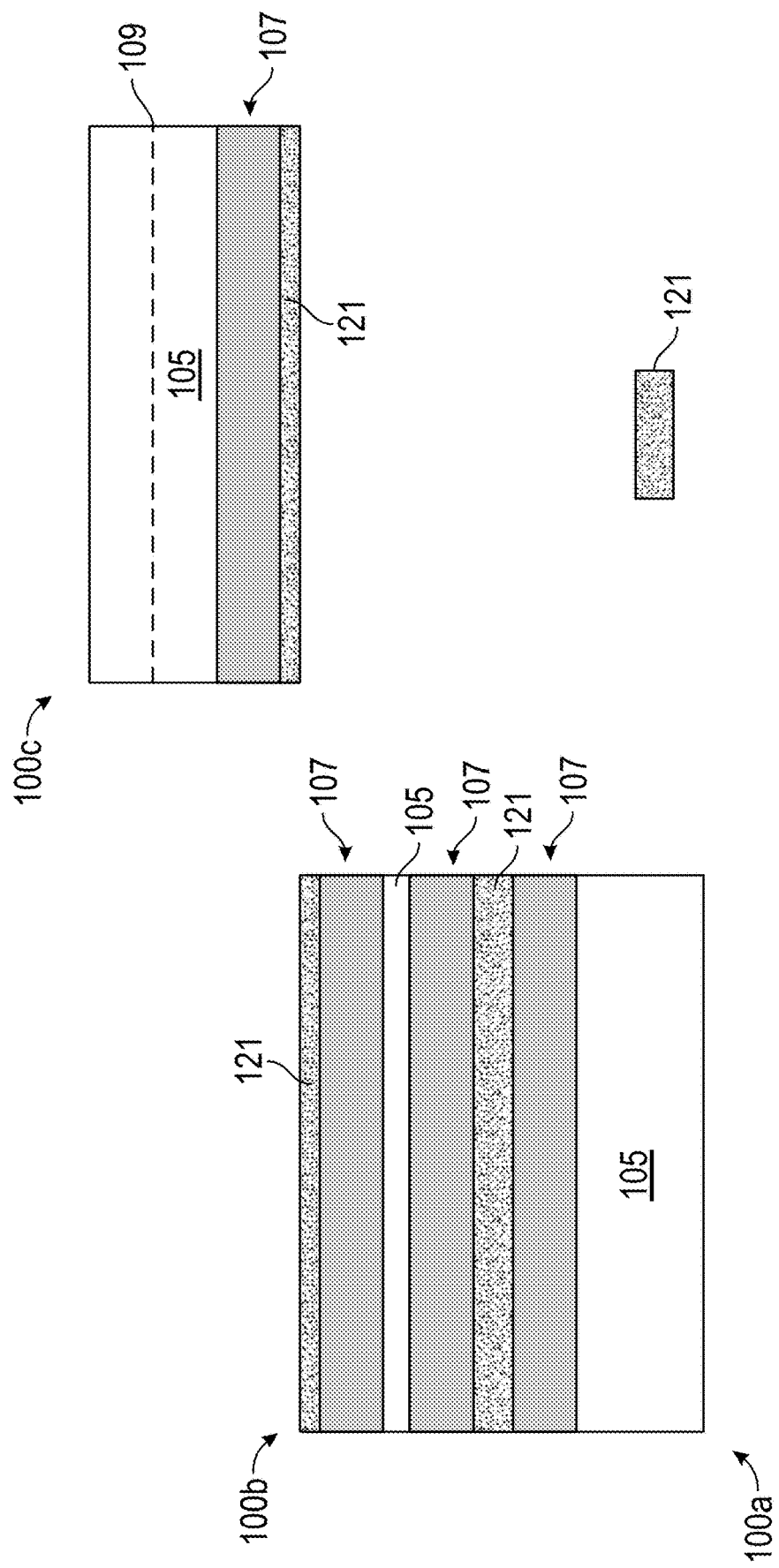
FIG. 12 is a cross-sectional view of a substrate showing a nanolayer stack after bonding and before bonding of a third wafer.

FIG. 12 is a cross-sectional view of the substrate 105 showing the nanolayer stack 107 after bonding and before bonding of the third wafer 100c. In an embodiment, the nanolayer stack 107 can be formed on the bottom surface of the substrate 105 of the third wafer 100c. Additionally, the nanolayer stack 107 can be formed on the thinned substrate 105 of the second wafer 100b on the combined structure. The top surface of the substrate 105 of the third wafer 100c can then be optionally implanted with ionized atoms for cutting or cleaving during anneal.

Figure 13:
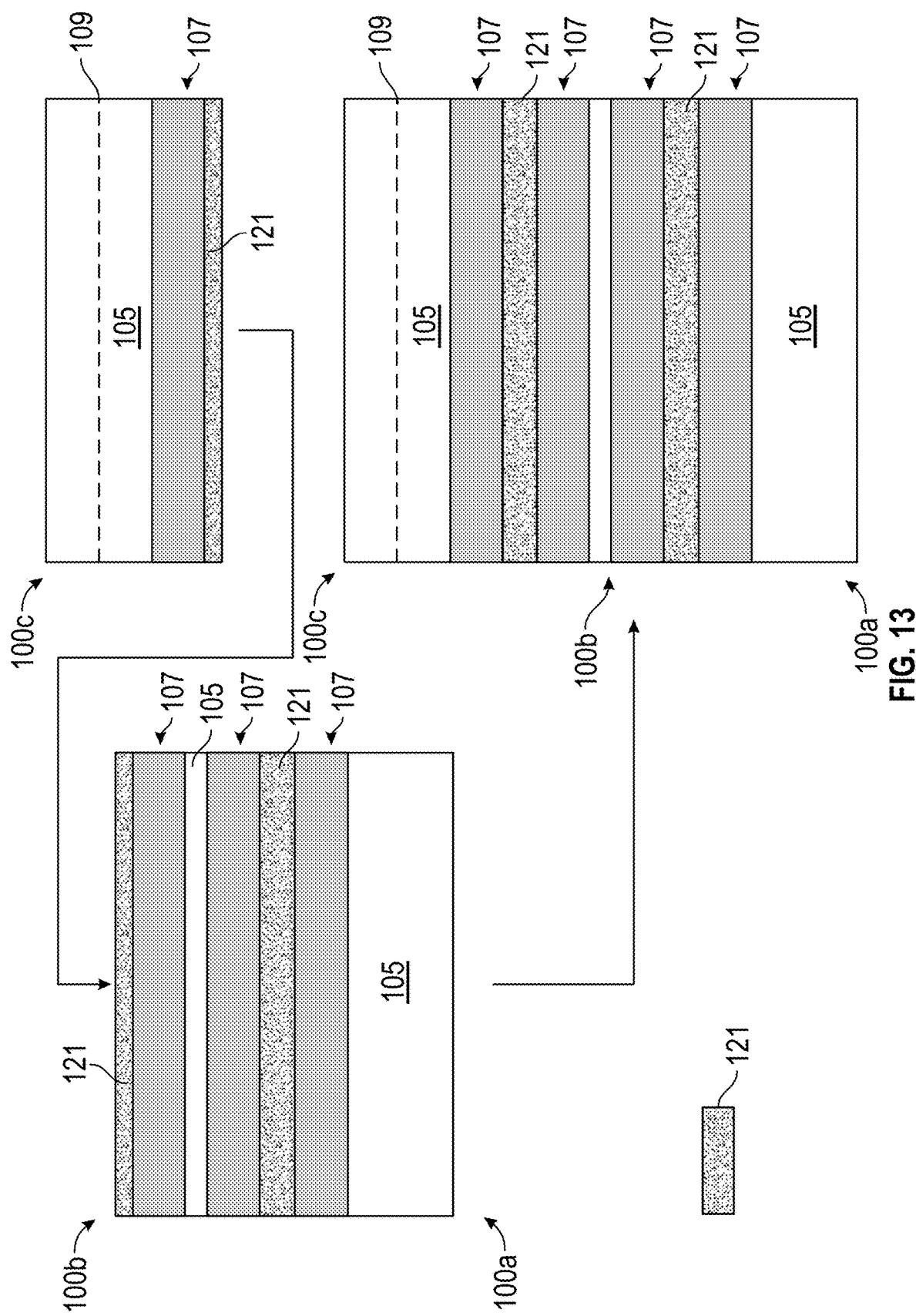
FIG. 13 is a cross-sectional view of a substrate showing a nanolayer stack during bonding, according to an embodiment of the present disclosure.

FIG. 13 is a cross-sectional view of the substrate 105 showing the nanolayer stack 107 during bonding, according to an embodiment of the present disclosure. In an embodiment, nanolayer stacks 107 of the combined structure and the third wafer 100c can be bonded together via joining the deposited bonding films 121 together during the anneal.

Figure 14:
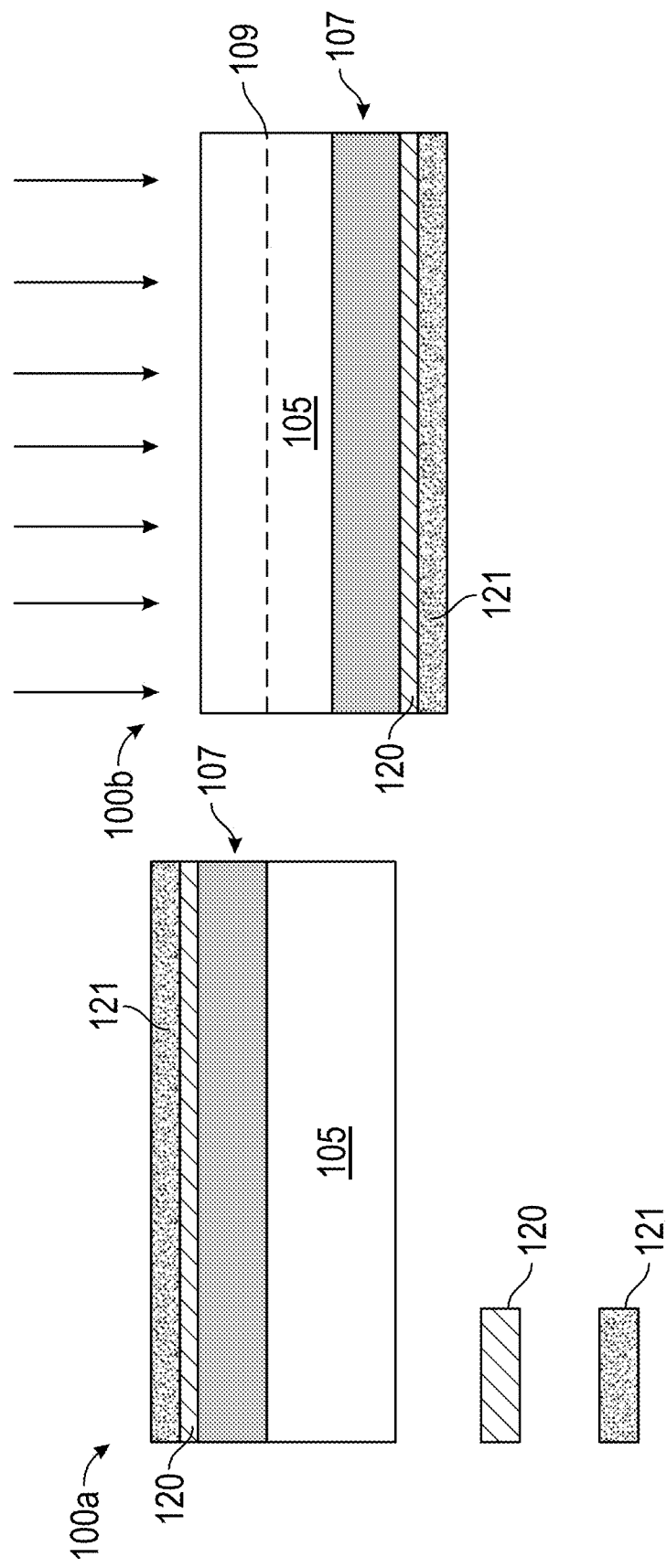
FIGS. 14-15 are cross sectional views of the preparation and bonding of a combined structure with dual oxide layers, according to an embodiment of the present disclosure.
Figure 15:
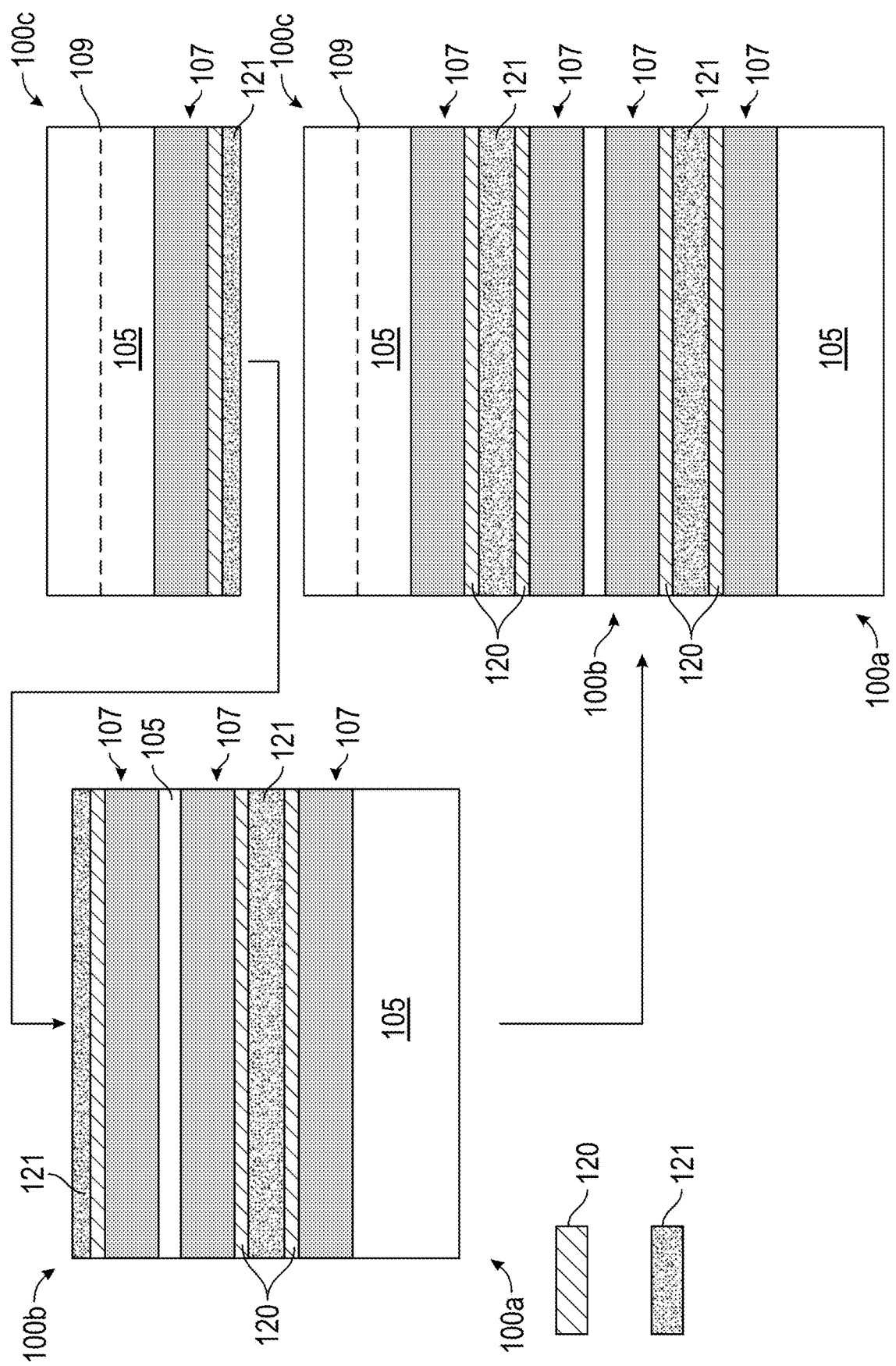

FIGS. 14-15 are cross sectional views of the preparation and bonding of the combined structure with dual oxide layers, according to an embodiment of the present disclosure. In an embodiment, the chemical bonding film 120 is first formed on the nanolayer stacks 107 of the first, second, and third wafers 100a, 100b, 100c, followed by deposition of the deposited bonding film 121 on top of the chemical bonding film 120. This combines an oxide left by cleaning chemistry, followed by a deposition process using ALD, CVD, etc.

Figure 16:
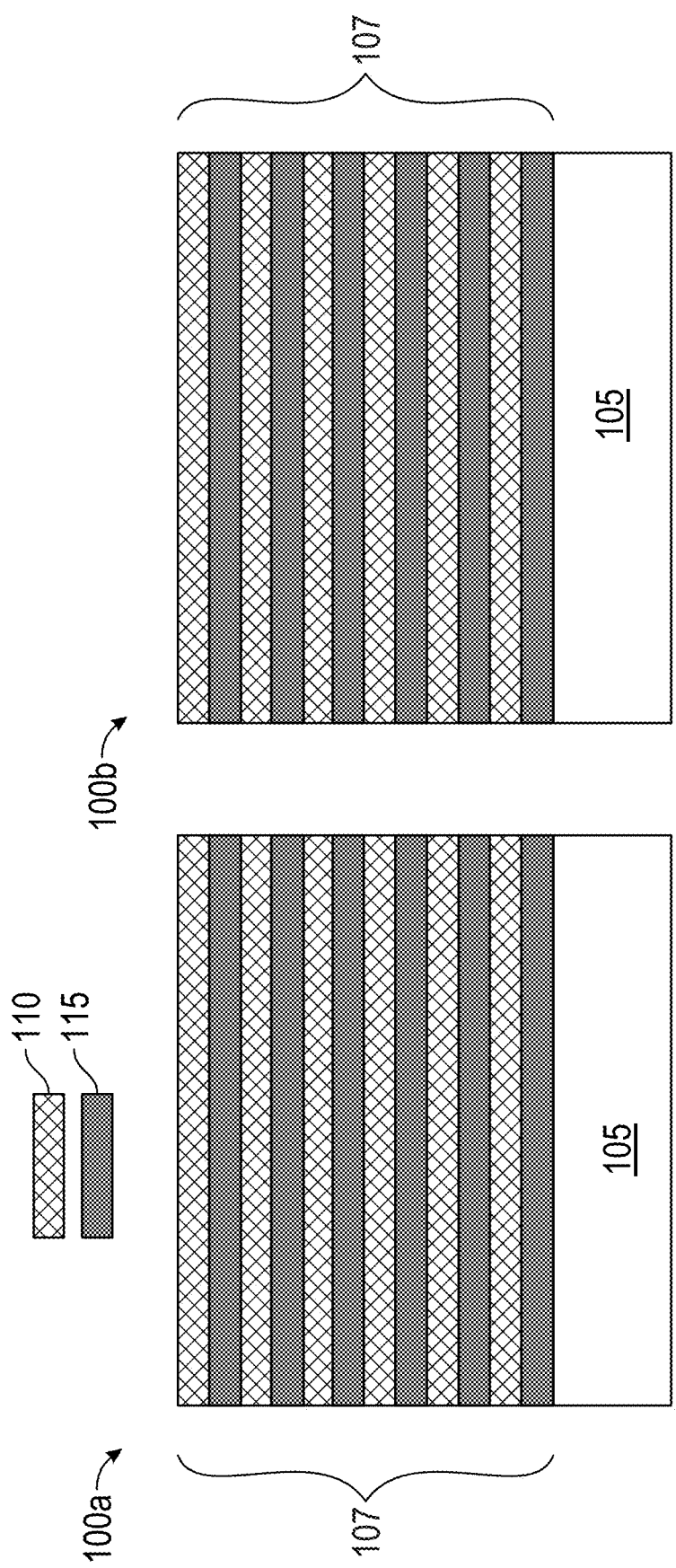
FIG. 16 is a cross-sectional view of a substrate showing an example result of a nanolayer stack, according to an embodiment of the present disclosure.

FIG. 16 is a cross-sectional view of the substrate 105 showing an example result of the nanolayer stack 107, according to an embodiment of the present disclosure. In an embodiment, the nanolayer stack 107 can be formed on the top surface of the substrate 105 of the first wafer 100a. The nanolayer stack 107 can be additionally formed on the second wafer 100b, wherein the nanolayer stack 107 can be formed on the bottom surface of the substrate 105 of the second wafer 100b.

Figure 17:
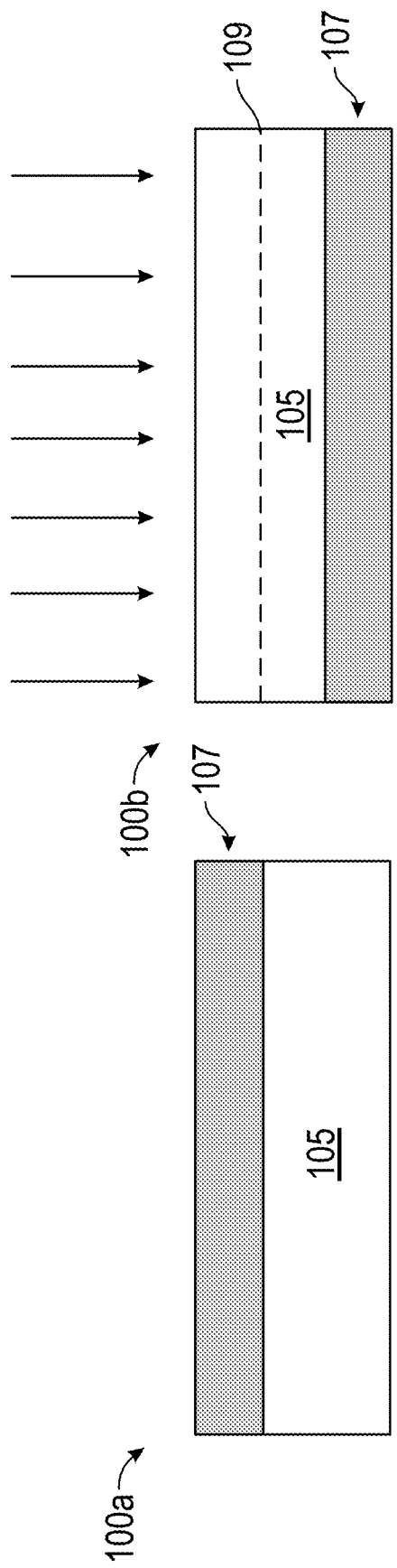
FIG. 17 is a cross-sectional view of a substrate showing a nanolayer stack during an ionized atom implantation of a second wafer, according to an embodiment of the present disclosure.

FIG. 17 is a cross-sectional view of the substrate 105 showing the nanolayer stack 107 during an ionized atom implantation of the second wafer 100b, according to an embodiment of the present disclosure. In an embodiment, ionized atoms can be implanted into the surface opposite the nanolayer stack 107 on the second wafer 100b to produce the cleave 109. As shown, the top surface of the second wafer 100b can be implanted with the ionized atoms.

Figure 18:
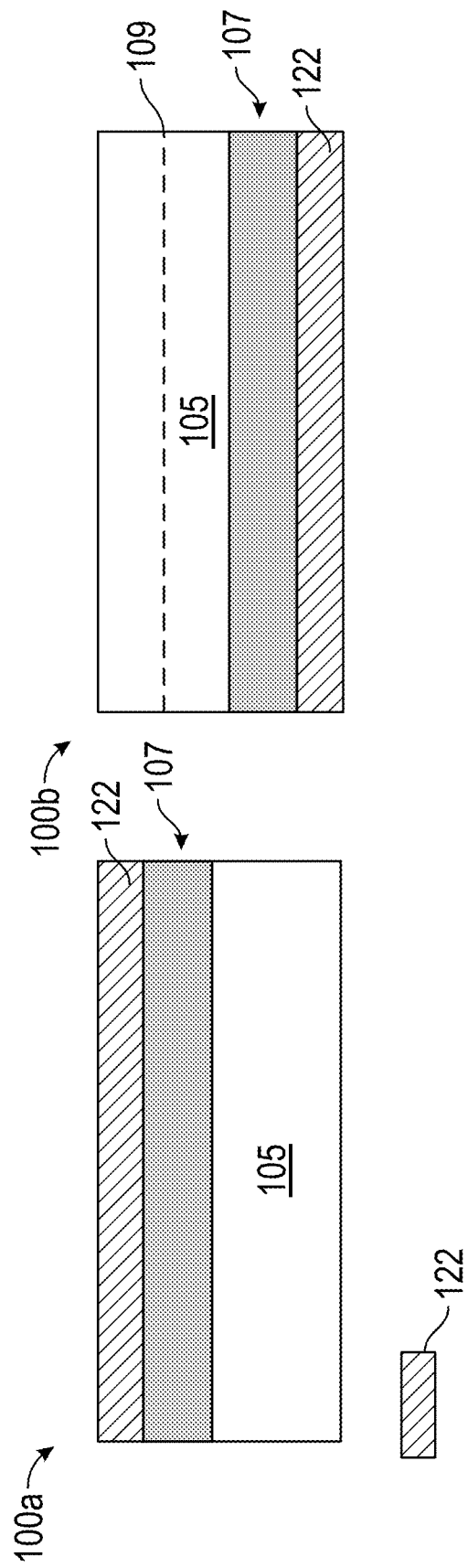
FIG. 18 is a cross-sectional view of a substrate showing a nanolayer stack during formation of a carbon-containing bonding film, according to an embodiment of the present disclosure.

FIG. 18 is a cross-sectional view of the substrate 105 showing the nanolayer stack 107 during formation of a carbon-containing bonding film 122, according to an embodiment of the present disclosure. In an embodiment, the carbon-containing bonding film 122 can be epitaxially grown on the top of the nanolayer stacks 107. Alternatively, the carbon-containing bonding film 122 can be deposited on the top surface of the nanolayer stack 107. For example, the carbon-containing bonding film 122 can be SiC or SiCN. The carbon-containing bonding film 122 can have a thickness in the range of, for example, 10 to 100 A for each of the first wafer 100a and the second wafer 100b. The deposited bonding films 121 of the first wafer 100a and the second wafer 100b can be aligned and bonded together via the anneal.

Figure 19:
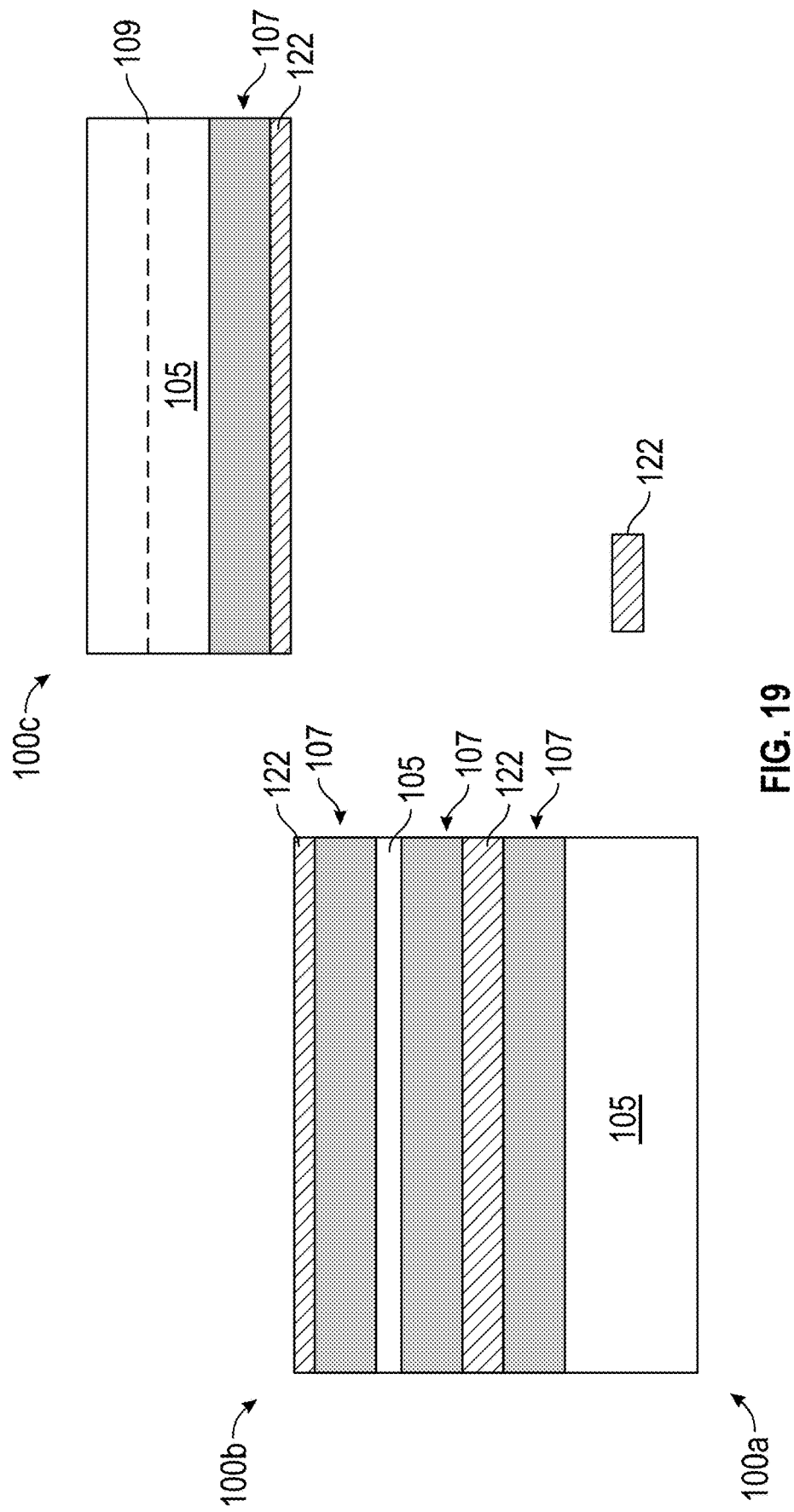
FIG. 19 is a cross-sectional view of a substrate showing a nanolayer stack after bonding and before bonding of a third wafer, according to an embodiment of the present disclosure.

FIG. 19 is a cross-sectional view of the substrate 105 showing the nanolayer stack 107 after bonding and before bonding of the third wafer 100c, according to an embodiment of the present disclosure. In an embodiment, the nanolayer stack 107 can be formed on the bottom surface of the substrate 105 of the third wafer 100c. Additionally, the nanolayer stack 107 can be formed on the thinned substrate 105 of the second wafer 100b on the combined structure. The top surface of the substrate 105 of the third wafer 100c can then be optionally implanted with ionized atoms for cutting or cleaving during anneal.

Figure 20:
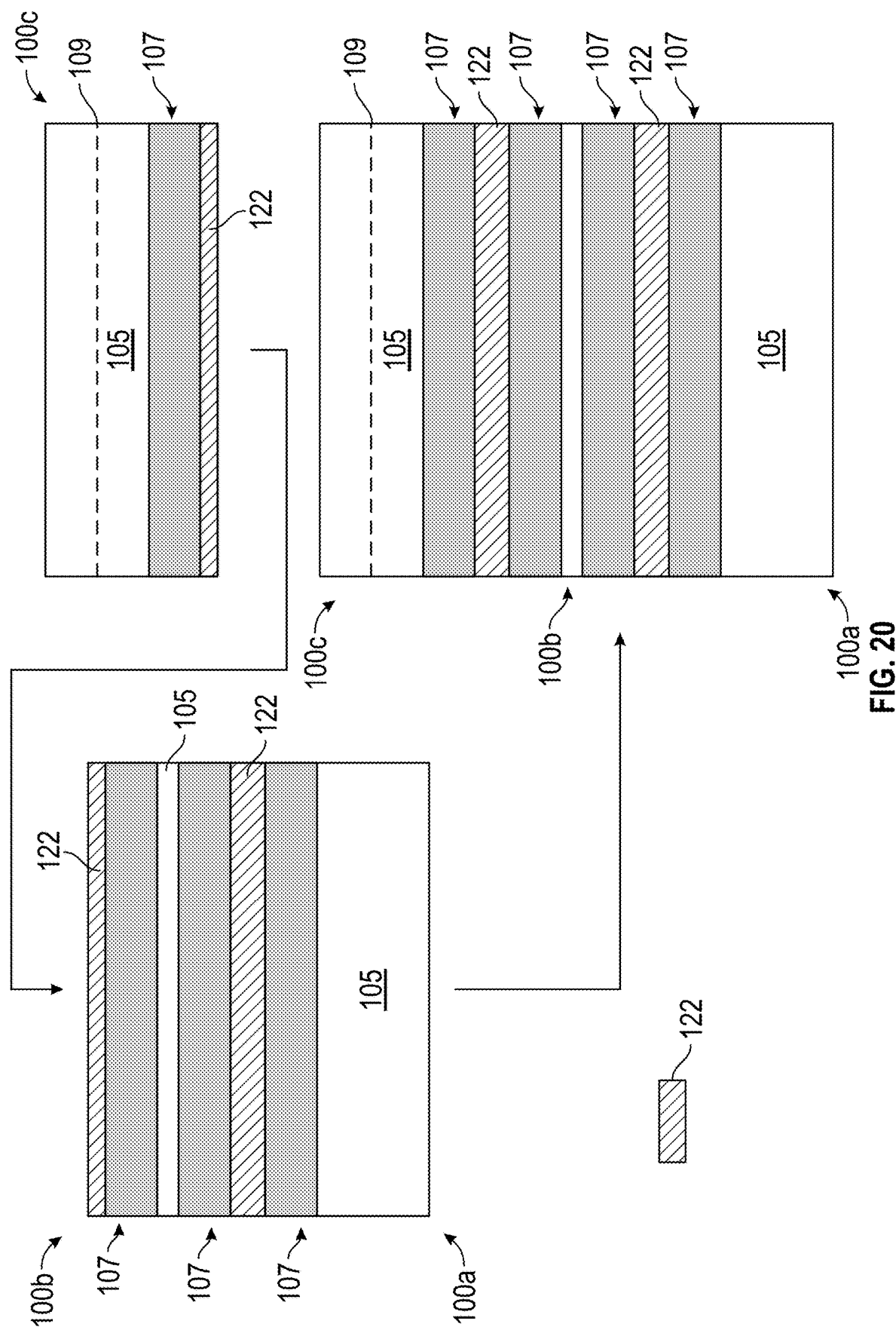
FIG. 20 is a cross-sectional view of a substrate showing a nanolayer stack during bonding, according to an embodiment of the present disclosure.

FIG. 20 is a cross-sectional view of the substrate 105 showing the nanolayer stack 107 during bonding, according to an embodiment of the present disclosure. In an embodiment, nanolayer stacks 107 of the combined structure and the third wafer 100c can be bonded together via joining the carbon-containing bonding films 122 together during the anneal.

Figure 21:
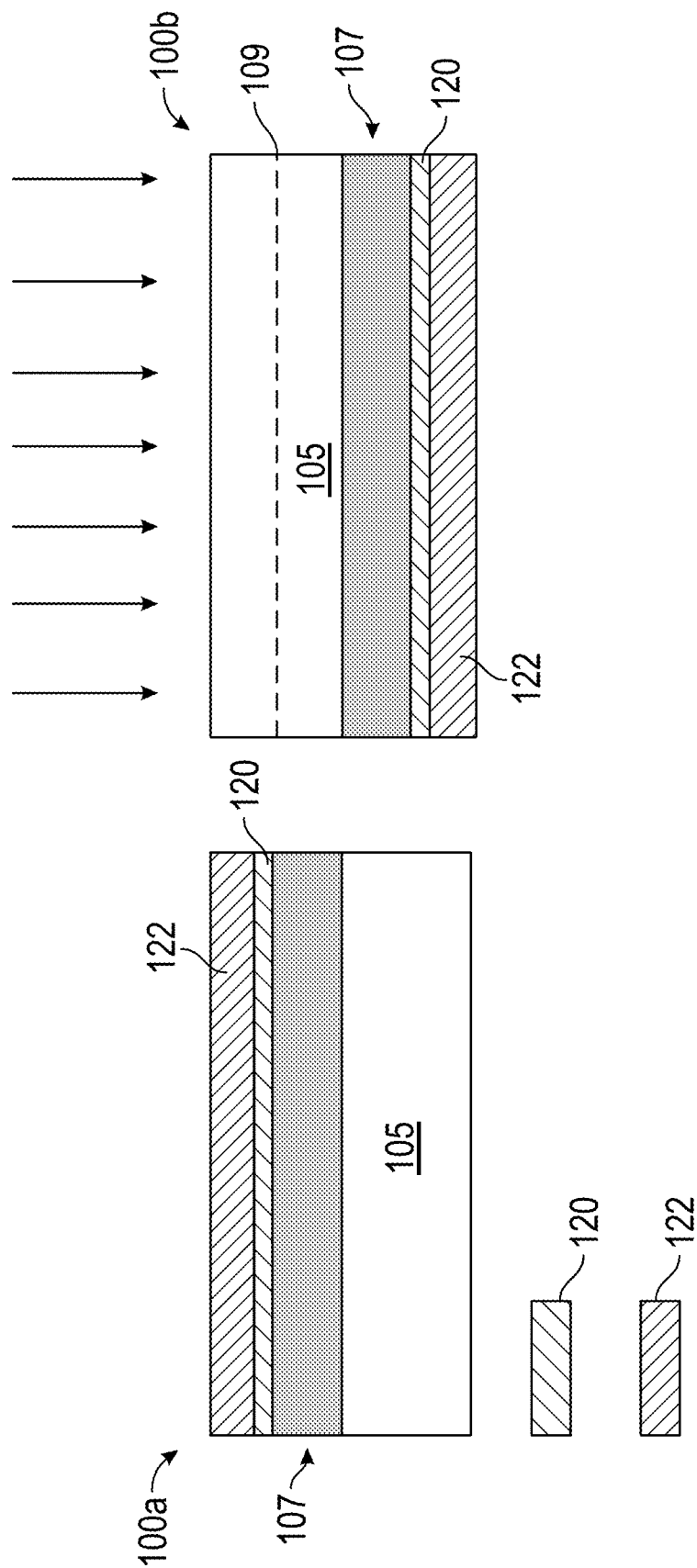
FIGS. 21-22 are cross sectional views of the preparation and bonding of a combined structure with dual oxide layers, according to an embodiment of the present disclosure.
Figure 22:
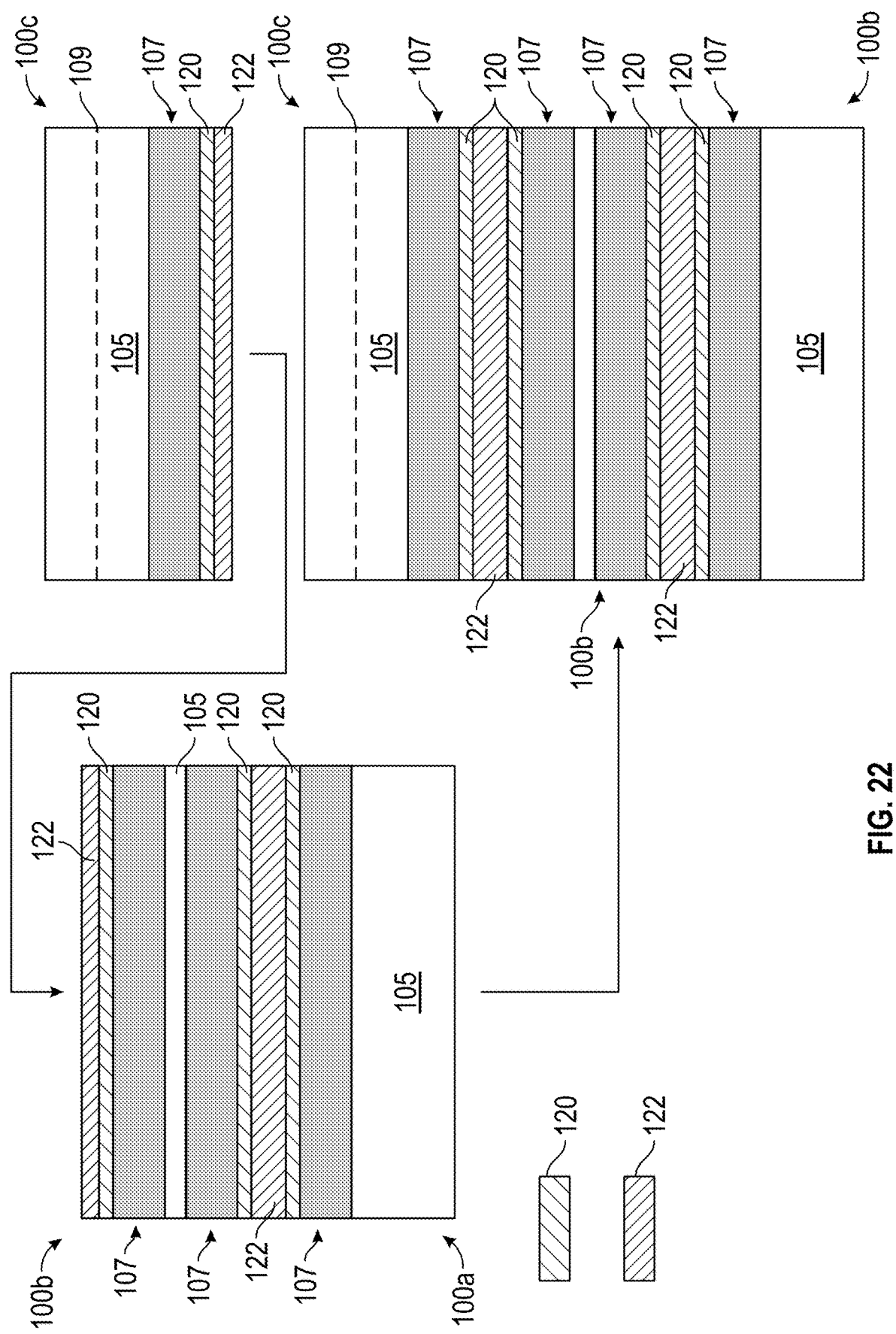

FIGS. 21-22 are cross sectional views of the preparation and bonding of the combined structure with dual oxide layers, according to an embodiment of the present disclosure. In an embodiment, the chemical bonding film 120 is first formed on the nanolayer stacks 107 of the first, second, and third wafers 100a, 100b, 100c, followed by formation of the carbon-containing bonding film 122 on top of the chemical bonding film 120. This combines an oxide left by cleaning chemistry, followed by a deposition process using ALD, CVD, etc. For example, SiC or $SiC_xN_y$ (x ranges from 0.7 to 1.1 and y ranges from 0.1 to 0.4) can be deposited on the chemical bonding film 120. The carbon-containing bonding film 122 can be deposited by ALD, CVD, PECVD, MOCVD, and sputter deposition, among others. Note that depending on a selected deposition technique, a post SiCN anneal is an option from 200° C. to 400° C. Optionally, a thicker film can be deposited, then polished. Other interfaces besides oxide can also be used.

Figure 23:
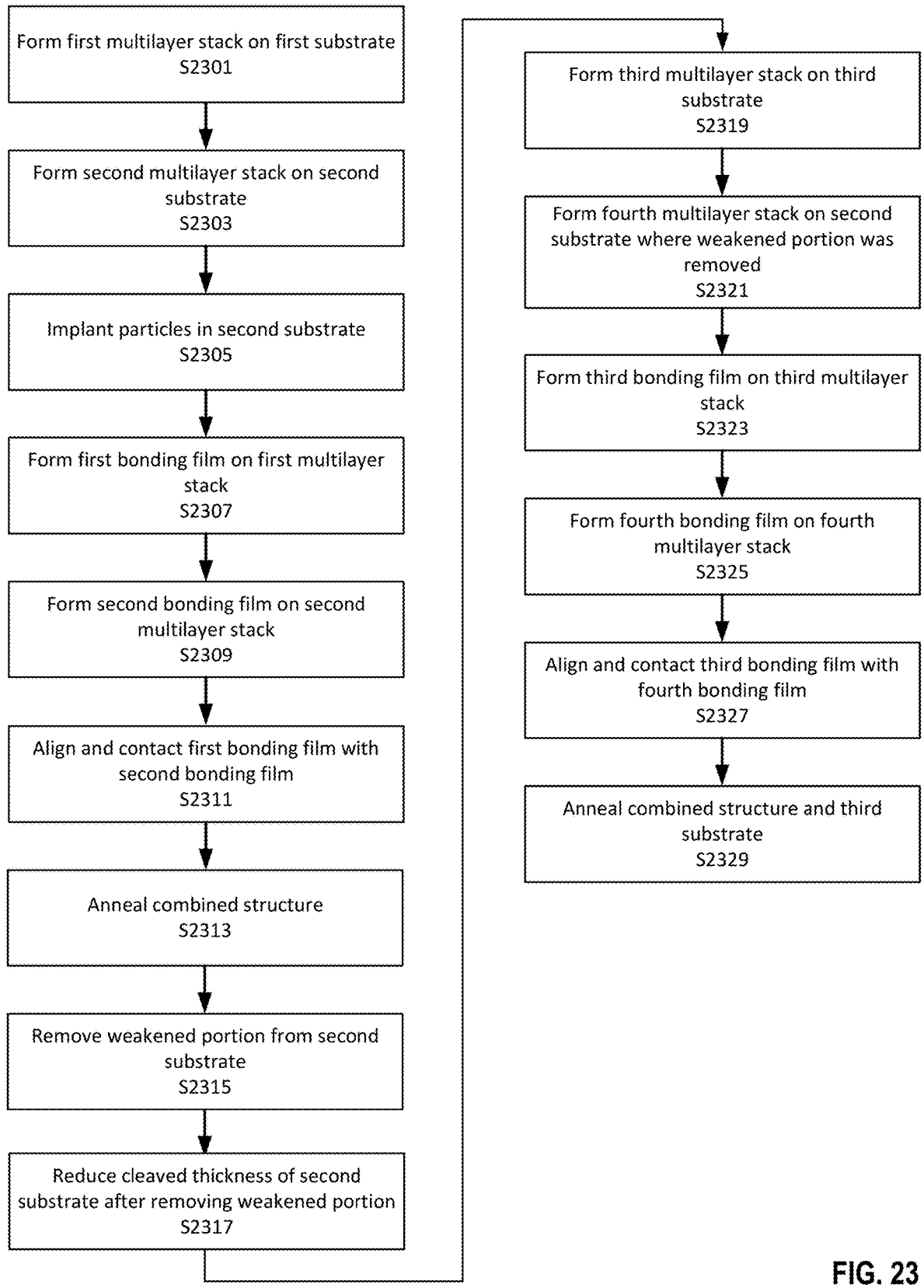
FIG. 23 is a flow chart for a method of fabricating a semiconductor device, according to an embodiment of the present disclosure.

FIG. 23 is a flow chart for a method of fabricating a semiconductor device, according to an embodiment of the present disclosure. The described method is summarized as follows. In step S2301, a first nanolayer stack 107 is formed on a substrate 105 of a first wafer 100a. In step S2303, a second nanolayer stack 107 is formed on the substrate 105 of a second wafer 100b. In step S2305, ionized atoms are implanted into the substrate 105 of the second wafer 100b opposite the side of the second nanolayer stack 107 on the substrate 105 of the second wafer 100b. In step S2307, a first bonding film 120 is formed on the first nanolayer stack 107. In step S2309, a second bonding film 120 is formed on the second nanolayer stack 107. In step S2311, the first and second bonding films 120 are aligned and contacted to bond the first and second nanolayer stacks 107 into a combined structure. In step S2313, the combined structure is annealed, which weakens a portion of the implanted substrate 105 of the second wafer 100b. In step S2315, the weakened portion of the substrate 105 of the second wafer 100b is removed. In step S2317, the thickness of the remaining portion of the substrate 105 of the second wafer 100b (i.e. the cleaved thickness) is reduced via etching or CMP, for instance. In step S2319, a third nanolayer stack 107 is formed on the substrate 105 of a third wafer 100c. In step S2321, a fourth nanolayer stack 107 is formed on the substrate 105 of the second wafer 100b where the weakened portion was removed. In step S2323, a third bonding film 120 is formed on the third nanolayer stack 107. In step S2325, a fourth bonding film 120 is formed on the fourth nanolayer stack 107. In step S2327, the third bonding film 120 and the fourth bonding film 120 are aligned and contacted to bond the combined structure and the third nanolayer stack 107. In step S2329, the combined structure is annealed, the combined structure including the third wafer 100c.

Accordingly, techniques herein enable various embodiments and process flows for forming stacks of many single-crystal silicon layers or other silicon layers to enable high-density (per volume) of semiconductor devices. Accordingly, a certain amount of layers of epitaxial silicon can be grown. The number of layers can be limited to maintain high quality materials. For example, going beyond 12 layers of epitaxial growth can result is poor electrical performance and even failure. The epitaxial stack can be formed into transistor devices before or after being bonded. Instead of an epitaxial stack, the stack can be a memory stack or other logic circuits. Accordingly, these epitaxial stacks can be device planes of either logic, memory or other devices. As can be appreciated, various combinations are possible.

Bonding is then accomplished using one or more bonding layers on each epitaxial stack. Bonding layers are preferably oxide or carbon-containing. Bonding layers can be formed of different thicknesses depending on design specifications. An accompanying implantation step can be used to assist with thinning of backside bulk silicon for combining additional epitaxial stacks and/or accessing the epitaxial stacks for continued fabrication.

As can be appreciated, techniques herein can for more than 48 nanoplanes of high quality single-crystal silicon. Bonding processes can be executed a relatively low temperatures. Optionally, complete devices can metal connections can be formed prior to bonding wafers, which enables any type of stacking (memory on logic, custom circuit designs). Bonding can occur using relatively thin interface thicknesses. Optionally, and isolation layer can be used between silicon planes.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of fabricating a semiconductor device, comprising:
   forming a first multilayer stack on a first surface of a first substrate, the first substrate having a second surface opposite the first surface of the first substrate, the first multilayer stack comprising alternating layers of a first material and a second material;
   forming a second multilayer stack on a second surface of a second substrate, the second substrate having a first surface opposite the second surface of the second substrate, the second multilayer stack comprising alternating layers of a third material and a fourth material;
   implanting ionized atoms to a predetermined depth in the first surface of the second substrate;
   forming a first bonding film on a top surface of the first multilayer stack and forming a second bonding film on a top surface of the second multilayer stack;
   aligning the first substrate with the second substrate such that the first bonding film is in contact with the second bonding film; and
   annealing the first substrate and the second substrate to bond the first bonding film with the second bonding film and form a combined structure, the annealing also weakening a portion of the second substrate approximately at the predetermined depth of the implanting.

2. The method of claim 1, wherein the ionized atoms have an atomic number less than 12.

3. The method of claim 1, wherein implanting the ionized atoms includes implanting a first type of ionized atom and implanting a second type of particle.

4. The method of claim 3, wherein the first type of ionized atom is selected from the group consisting of H, $H_2$, He, and boron.

5. The method of claim 1, wherein the first and third material are silicon, and the second and fourth material are $SiGe_2$.

6. The method of claim 1, wherein forming the first bonding film and forming the second bonding film includes performing an oxide deposition process.

7. The method of claim 6, wherein the first bonding film and the second bonding film each have a thickness of 30 angstroms to 300 angstroms.

8. The method of claim 1, wherein forming the first bonding film and forming the second bonding film includes cleaning the top surface of the first multilayer stack using a liquid chemistry to form a first chemical oxide film thereon and cleaning the top surface of the second multilayer stack using the liquid chemistry to form a second chemical oxide film thereon.

9. The method of claim 8, wherein the first chemical oxide film and the second chemical oxide film each have a thickness of 5 angstroms to 30 angstroms.

10. The method of claim 8, wherein forming the first bonding film and forming the second bonding film includes executing an oxide deposition process after the cleaning that deposits an oxide layer on the first chemical oxide film and the second chemical oxide film, thus forming a bilayer oxide on each of the multilayer stacks.

11. The method of claim 1, wherein the first multilayer stack and the second multilayer stack each have at least four layers.

12. The method of claim 1, further comprising:
    forming a first carbon-containing bonding film on the first bonding film; and
    forming a second carbon-containing bonding film on the second bonding film, wherein aligning the first substrate with the second substrate includes the first carbon-containing bonding film being in contact with the second carbon-containing bonding film.

13. The method of claim 1, further comprising:
cleaning the weakened portion of the second substrate.

14. The method of claim 13, further comprising:
reducing a cleaved thickness of the second substrate to a predetermined thickness after removing the weakened portion.

15. The method of claim 14, wherein the cleaved thickness of the second substrate is reduced to less than 60 nm.

16. The method of claim 14, further comprising:
forming a third multilayer stack on a first surface of a third substrate, the third substrate having a second surface opposite the first surface of the third substrate, the third multilayer stack comprising alternating layers of the third material and the fourth material;
forming a fourth multilayer stack on the second substrate of the combined structure, the fourth multilayer stack comprising alternating layers of the first material and the second material with each layer formed by epitaxial growth beginning from a surface formed from removing the weakened portion of the second substrate after thickness reduction;
forming a third bonding film on a top surface of the third multilayer stack and forming a fourth bonding film on a top surface of the fourth multilayer stack;
aligning the third substrate with the combined structure such that the third bonding film is in contact with the fourth bonding film; and
annealing the combined structure and the third substrate to bond the third bonding film with the fourth bonding film, thus making the third substrate part of the combined structure.

17. The method of claim 16, further comprising:
implanting ionized atoms to the predetermined depth in the first surface of the third substrate before forming the third bonding film on the top surface of the third multilayer stack, wherein
the annealing the combined structure and the third substrate also weakens a portion of the third substrate approximately at the predetermined depth of the implanting.

18. The method of claim 17, further comprising:
removing the weakened portion of the third substrate; and
reducing a cleaved thickness of the third substrate to a predetermined thickness after removing the weakened portion.

19. A method of fabricating a semiconductor device, comprising:
forming a first multilayer stack on a first surface of a first substrate, the first substrate having a second surface opposite the first surface of the first substrate, the first multilayer stack comprising alternating layers of a first material and a second material, the first multilayer stack including at least six layers epitaxially grown;
forming a second multilayer stack on a second surface of a second substrate, the second substrate having a first surface opposite the second surface of the second substrate, the second multilayer stack comprising alternating layers of a third material and a fourth material, the second multilayer stack including at least six layers epitaxially grown;
implanting ionized atoms to a predetermined depth in the first surface of the second substrate;
forming a first bonding film on a top surface of the first multilayer stack and forming a second bonding film on a top surface of the second multilayer stack;
aligning the first substrate with the second substrate such that the first bonding film is in contact with the second bonding film;
annealing the first substrate and the second substrate to bond the first bonding film with the second bonding film and form a combined structure, the annealing also weakening a portion of the second substrate approximately at the predetermined depth of the implanting;
removing the weakened portion of the second substrate; and
forming at least one transistor device from the combined structure.

20. The method of claim 19, further comprising:
after removing the weakened portion of the second substrate, thinning a remainder of the second substrate to entirely remove the remainder of the second substrate and expose the combined first multilayer stack and second multilayer stack.

* * * * *

UNITED STATES PATENT AND TRADEMARK OFFICE
CERTIFICATE OF CORRECTION

| | | |
|---|---|---|
| PATENT NO. | : 11,177,250 B2 | Page 1 of 1 |
| APPLICATION NO. | : 16/854340 | |
| DATED | : November 16, 2021 | |
| INVENTOR(S) | : Gardner et al. | |

It is certified that error appears in the above-identified patent and that said Letters Patent is hereby corrected as shown below:

On the Title Page

Column 2, Item (57), under "ABSTRACT", Line 5, delete "the bonding".

Signed and Sealed this
Seventeenth Day of May, 2022

Katherine Kelly Vidal
*Director of the United States Patent and Trademark Office*